(12) United States Patent
Podlesnik et al.

(10) Patent No.: US 6,827,869 B2
(45) Date of Patent: Dec. 7, 2004

(54) METHOD OF MICROMACHINING A MULTI-PART CAVITY

(76) Inventors: Dragan Podlesnik, 1726 Oak Creek Dr., Palo Alto, CA (US) 94304; Thorsten Lill, 880 E. Fremont Ave., #634, Sunnyvale, CA (US) 94087; Jeff Chinn, 605 St. Croix La., Foster City, CA (US) 94404; Shaoher X. Pan, 1133 Kelez Dr., San Jose, CA (US) 95120; Anisul Khan, 1180 Lochinvar Ave. #53, Sunnyvale, CA (US) 94087; Maocheng Li, 725 Honda Way, Fremont, CA (US) 94539; Yiqiong Wang, 2678 Calico Ct., Morgan Hill, CA (US) 95037

( * ) Notice: Subject to any disclaimer, the term of this patent is extended or adjusted under 35 U.S.C. 154(b) by 0 days.

(21) Appl. No.: 10/194,167

(22) Filed: Jul. 11, 2002

(65) Prior Publication Data

US 2002/0185469 A1 Dec. 12, 2002

Related U.S. Application Data

(63) Continuation of application No. 09/372,477, filed on Aug. 11, 1999, now abandoned.

(51) Int. Cl.⁷ .............................. H01L 21/302
(52) U.S. Cl. ............... 216/17; 216/2; 216/18; 216/46; 438/700; 438/710; 438/733
(58) Field of Search ................ 216/2, 17, 18, 216/46; 438/700, 710, 738, 446

(56) References Cited

U.S. PATENT DOCUMENTS

| | | | |
|---|---|---|---|
| 4,472,240 A | 9/1984 | Kameyama | 156/648 |
| 4,845,048 A | 7/1989 | Tamaki et al. | 437/62 |
| 4,895,810 A | 1/1990 | Meyer et al. | 431/41 |
| 4,999,312 A | 3/1991 | Yoon | 437/52 |

(List continued on next page.)

FOREIGN PATENT DOCUMENTS

| | | | |
|---|---|---|---|
| EP | 0 272 143 | 6/1988 | H01L/21/306 |
| EP | 0540262 | 5/1993 | H01L/21/76 |
| EP | 0 565 212 A2 | 10/1993 | H01L/21/306 |
| EP | 0 680 085 A | 11/1995 | H01L/21/768 |
| EP | 0 729 175 A | 8/1996 | H01L/21/306 |
| EP | 0 821 409 A2 | 1/1998 | H01L/21/8242 |

(List continued on next page.)

OTHER PUBLICATIONS

Copy of Search Report in corresponding European Patent Application No. 00117155.2, mailed Feb. 19, 2003.

(List continued on next page.)

*Primary Examiner*—Nadine G. Norton
*Assistant Examiner*—Shamim Ahmed
(74) *Attorney, Agent, or Firm*—Shirley L. Church; Joseph Bach; Kathi Bean

(57) ABSTRACT

The present disclosure pertains to our discovery of a particularly efficient method for etching a multi-part cavity in a substrate. The method provides for first etching a shaped opening, depositing a protective layer over at least a portion of the inner surface of the shaped opening, and then etching a shaped cavity directly beneath and in continuous communication with the shaped opening. The protective layer protects the etch profile of the shaped opening during etching of the shaped cavity, so that the shaped opening and the shaped cavity can be etched to have different shapes, if desired. In particular embodiments of the method of the invention, lateral etch barrier layers and/or implanted etch stops are also used to direct the etching process. The method of the invention can be applied to any application where it is necessary or desirable to provide a shaped opening and an underlying shaped cavity having varying shapes. The method is also useful whenever it is necessary to maintain tight control over the dimensions of the shaped opening.

21 Claims, 23 Drawing Sheets

U.S. PATENT DOCUMENTS

| | | | |
|---|---|---|---|
| 5,182,234 A | 1/1993 | Meyer | 437/233 |
| 5,229,315 A | 7/1993 | Jun et al. | 437/67 |
| 5,318,665 A | 6/1994 | Oikawa | 156/643 |
| 5,482,883 A | 1/1996 | Rajeevakumar | 437/52 |
| 5,635,423 A | 6/1997 | Huang et al. | 437/195 |
| 5,656,535 A | 8/1997 | Ho et al. | 438/386 |
| 5,658,472 A | 8/1997 | Bartha et al. | 216/2 |
| 5,686,354 A | 11/1997 | Avanzino et al. | 437/190 |
| 5,801,094 A * | 9/1998 | Yew et al. | 438/624 |
| 5,874,362 A * | 2/1999 | Wong et al. | 438/719 |
| 5,882,996 A * | 3/1999 | Dai | 438/597 |
| 5,916,823 A | 6/1999 | Lou et al. | 438/738 |
| 5,920,799 A * | 7/1999 | Graves et al. | 438/798 |
| 6,015,761 A | 1/2000 | Merry et al. | 438/727 |
| 6,051,503 A | 4/2000 | Bhardwaj et al. | 438/705 |
| 6,051,866 A | 4/2000 | Shaw et al. | 257/417 |
| 6,074,954 A | 6/2000 | Lill et al. | 438/710 |
| 6,075,269 A | 6/2000 | Terasawa et al. | 257/330 |
| 6,093,330 A | 7/2000 | Chong et al. | 216/2 |
| 6,188,125 B1 | 2/2001 | Havemann | 257/640 |
| 6,204,096 B1 * | 3/2001 | Lai et al. | 438/128 |
| 6,235,638 B1 | 5/2001 | Huang et al. | 438/695 |

FOREIGN PATENT DOCUMENTS

| | | | |
|---|---|---|---|
| EP | 0 822 582 A | 2/1998 | H01L/21/306 |
| EP | 0 822 593 A2 | 2/1998 | H01L/21/8242 |
| EP | 0 862 222 A | 9/1998 | H01L/29/744 |
| EP | 1049157 | 11/2000 | H01L/21/764 |
| JP | 06177264 | 6/1994 | H01L/21/90 |
| WO | WO 94 18697 | 8/1994 | H01L/21/24 |

OTHER PUBLICATIONS

Copy of a Search Report in corrsponding EP Application No. EP 00117155.2–1235. mailed Nov. 15, 2002.

Sato, Masaaki et al., Effect of Gas Species on the Depth Reduction in Silicon Deep–Submicron Trench Reactive Ion Etching, *Japanese Journal of Applied Physics*, vol. 30, No. 7, Jul. 1991 pp. 1549–1555.

Yeom, Geun–Young et al., Polysilicon Etch Back Plasma Process Using HBr, $Cl_2$, and $SF_6$ Gas Mixtures for Deep-Trench Isolation, *J. Electrochem. Soc.*, vol. 139, No. 2, Feb. 1992, pp. 575–579.

* cited by examiner

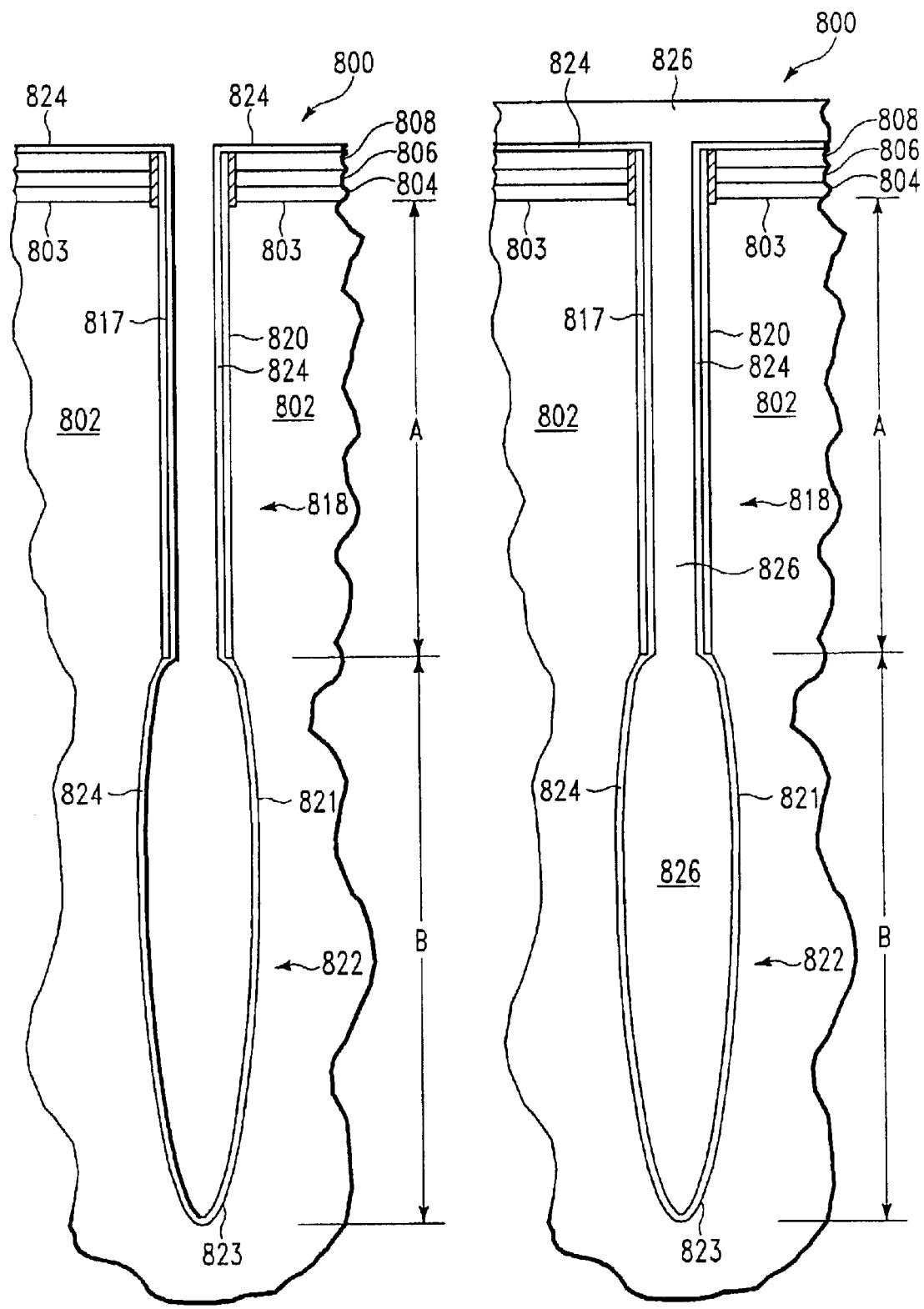

METHOD OF MICROMACHINING A MULTI-PART CAVITY

This application is a continuation application of Application Ser. No. 09/372,477, filed Aug. 11, 1999, now abandoned.

BACKGROUND OF THE INVENTION

1. Field of the Invention

The present invention pertains to a method of micromachining a multi-part cavity in a substrate, wherein different parts of the cavity may be formed to have different shapes. The present invention also pertains to a method of forming a multi-part cavity in a semiconductor substrate, for the purpose of manufacturing a semiconductor device.

2. Brief Description of the Background Art

Numerous methods for preparing semiconductor devices which include a trench in a silicon crystal silicon or polycrystalline silicon substrate have been described in the art. A few of these methods are described below.

U.S. Pat. Nos. 4,895,810 and 5,182,234, issued Jan. 23, 1990 and Jan. 26, 1993, respectively, to Meyer and Hollinger et al., disclose methods for creating a device structure where a trench is formed in an upper silicon surface and a source conductive layer is deposited to electrically contact a source region while a gate conductive layer is deposited atop a gate oxide layer.

U.S. Pat. No. 5,229,315, issued Jul. 20, 1993 to Jun et al., discloses a method for forming an isolated film on a semiconductor device comprising the steps of: forming a deep and narrow cylindrical groove in a substrate; filling up the groove with an oxide film, and oxidizing a polysilicon layer encircled by the groove, thereby forming an isolated film in the shape of a cylinder.

U.S. Pat. No. 5,318,665, issued Jun. 7, 1994 to Oikawa, discloses a reactive ion etch method which uses a mixed gas of HBr and Ar (10 to 25%) or a mixed gas of HBr, Ar (5 to 25%) and $O_2$ (0.2 to 2%) in etching a polysilicon film having a large step difference.

U.S. Pat. No. 5,656,535, issued Aug. 12, 1997 to Ho et al, discloses a simplified method of fabricating a storage node for a deep trench-based DRAM on a semiconductor substrate. The method involves etching a trench in a surface of the substrate and then forming a layer of dielectric material on a sidewall of the trench, the top portion of which is subsequently removed from the sidewall. Next, a layer of oxide is grown on the exposed portion of the sidewall. A portion of this layer of oxide is then removed from the sidewall in order to orient the layer of oxide a predetermined distance from the surface of the substrate. Finally, the trench is filled with a semiconductive material. The disclosure of this patent is hereby incorporated by reference herein in its entirety.

European Patent Publication Nos. 0272143 and 0565212, published Jun. 22, 1988 and Oct. 13, 1993, and assigned to the assignee of the present invention, disclose a process for etching single crystal silicon, polysilicon, silicide and polycide using iodinate or brominate gas chemistry. The disclosure of these patent publications are hereby incorporated by reference herein in their entireties.

European Patent Publication No. 0821409, published Jan. 28, 1998, by Coronel et al., discloses a collar etch method for a DRAM cell. In the manufacture of 16 Mbits DRAM chips, a polysilicon strap is used to provide an electrical contact between the drain region of the active NFET device and one electrode of the storage capacitor for each memory cell. In a conventional fabrication process, a $Si_3N_4$ pad layer is deposited onto the bare silicon substrate, then patterned. Next, deep trenches are formed in the substrate by dry etching. An ONO layer is conformally deposited into the trenches. The trenches are filled with undoped polysilicon. About 2.5 µm of undoped polysilicon is removed from the trench in a plasma etcher. A TEOS $SiO_2$ collar layer is conformally deposited, then anisotropically dry etched to leave only the so-called collar. Because trenches are present at the substrate surface, the thickness of the TEOS $SiO_2$ collar is not uniform. The above-referenced patent publication proposes a highly selective dry etch method to anisotropically etch the TEOS $SiO_2$ collar while preserving the $Si_3N_4$ pad layer thickness uniformity. A chemistry having a high TEOS $SiO_2/Si_3N_4$ selectivity (i.e., which etches TEOS $SiO_2$ faster than $Si_3N_4$ by a factor of at least six) is used to etch the TEOS $SiO_2$ collar layer. $C_4F_8$/Ar and $C_4F_8$/Ar/CO mixtures which have respective selectivities approximately equal to 9:1 and 15:1 (depending on gas ratios) are said to be adequate in all respects. When the surface of the $Si_3N_4$ pad layer is reached (this can be accurately detected), the etch is continued by an overetch of the TEOS $SiO_2$ layer to ensure a complete removal of the horizontal portions thereof. The disclosure of this patent publication is hereby incorporated by reference herein in its entirety.

European Patent Publication No. 0822593, published Feb. 4, 1998, by Haue et al., discloses a method of forming field effect transistors (FETs) on a silicon wafer. First, trenches are formed in a surface of the silicon wafer. An ONO layer is formed on the surface, lining the trenches. Potassium is diffused along the ONO layer. Part of the ONO layer is removed to expose the wafer surface with the ONO layer remaining in the trenches. Gate oxide is formed on the exposed wafer surface. Finally, FET gates are formed on the gate oxide.

Masasaki Sato et al. (*Jap. J Appl. Phys.*, Vol. 30, No. 7, pp. 1549–1555, April 1991) disclose the effect of gas species on the depth reduction in silicon deep submicron trench reactive ion etching. In silicon deep submicron trench reactive ion etching, a clearly larger microloading effect is found in fluorinated gas than in chlorinated gas. It was noted that adoption of a heavier halogen for the etching gas offers one way to eliminate the microloading effect because ion-assisted etching is dominant in heavier halogen etching.

Geun-Young Yeom et al. (*J. Electrochem. Soc.*, Vol. 139, No. 2, pp. 575–579, February 1992) disclose a polysilicon etchback plasma process using HBr, $Cl_2$, and $SF_6$ gas mixtures for deep trench isolation. A controllable trench polysilicon etchback profile with smooth surface and curvature was obtained by using 60 sccm HBr and 50 sccm $Cl_2$ gas mixture with 6 sccm $SF_6$ gas flow.

Commonly assigned, copending U.S. application Ser. No. 09/144,008, filed Aug. 31, 1998, by Lill et al., discloses a process for controlling the shape of the etch front in polysilicon etching applications, and a method for performing recess etchback of a polysilicon-filled trench formed in a substrate. Also disclosed is a method for forming a polysilicon-filled trench capacitor in a single-crystal silicon substrate, the trench capacitor including a dielectric collar and a buried strap. The method comprises a series of steps in which a semiconductor structure having an initial trench therein is the starting substrate.

The trench structure includes a single-crystal silicon substrate, at least one gate dielectric layer overlying a surface of the substrate, and at least one etch barrier layer overlying the gate dielectric layer. In the first step of the method, a conformal dielectric film is formed over the etch barrier layer and the sidewall and bottom of the trench. A layer of polysilicon is then applied to fill the trench. The polysilicon is then isotropically etched back to a predetermined depth within the trench using a plasma produced from a plasma source gas comprising a reactive species which selectively etches polysilicon. The plasma source gas comprises from about 80% to about 95% by volume of a fluorine-comprising gas, and from about 5% to about 20% by volume of an additive gas selected from a group consisting of a bromine-comprising gas, a chlorine-comprising gas, an iodine-comprising gas, or a combination thereof. After the polysilicon etchback, a collar is formed by application of a conformal layer of silicon oxide over the etch barrier layer, the sidewall of the trench, and the portion of the polysilicon which was exposed during the etching step. The silicon oxide collar is then anisotropically etched back to a first depth to expose the underlying polysilicon. The trench is then refilled with polysilicon. The polysilicon is subsequently etched back to a second predetermined depth within the trench using a plasma produced from a plasma source gas comprising a reactive species which selectively etches polysilicon. The plasma source gas comprises from about 80% to about 95% by volume of a fluorine-comprising gas, and from about 5% to about 20% by volume of an additive gas selected from a group consisting of a bromine-comprising gas, a chlorine-comprising gas, an iodine-comprising gas, or a combination thereof.

A wet etch step is then performed to remove an upper portion of the silicon oxide collar to a third predetermined depth. The trench is then refilled with polysilicon. The polysilicon is etched back to a fourth predetermined depth within the trench, while a portion of the single-crystal silicon substrate is simultaneously removed from the top portion of the sidewall above the silicon oxide collar, thereby forming a buried strap. Preferably, polysilicon containing a dopant such as arsenic is used for at least the last polysilicon fill step, in order to facilitate electron transfer through the buried strap. The disclosure of the above patent application is hereby incorporated by reference in its entirety.

While fully effective, the method disclosed by Lill et al. includes three separate polysilicon fill and etch steps and, as such, is time-consuming. It would therefore be highly desirable to develop a quicker, more streamlined method which would result in the production of an equivalent semiconductor structure.

SUMMARY OF THE INVENTION

While attempting to simplify the production method described by Lill et al., we discovered a general method for forming a multi-part cavity in a substrate which is useful in many different micromachining applications. The general method of the invention can be applied to any application where it is necessary or desirable to provide a structure having a shaped opening and at least one underlying shaped cavity, where it is necessary to maintain tight control over the dimensions of the shaped opening. There may be several different opening shapes and different cavity shapes within one etched structure. For example, the method of the invention can be used for micromachining of test chips for performance of various chemical or biological assays (e.g., genome testing), wherein the testing reagents would be contained in a plurality of shaped cavities etched in the chip. The method of the invention can also be used for micromachining of electrostatically controlled nozzles for use in inkjet printers, wherein the ink would be contained in the shaped cavity and the shaped opening would function as a nozzle. The method of the invention allows for excellent control over the critical dimensions of the shaped opening(s) (e.g., the diameter of the nozzle), providing for consistent and reproducible micromachining of a variety of devices. Adapting the general method of the invention disclosed herein for use in a particular application can easily be done by one skilled in the art with minimal experimentation.

In accordance with the general method of the invention, a substrate is etched to a first predetermined depth to form a shaped opening. A conformal protective layer is then formed on at least the sidewall of the shaped opening. The protective layer comprises a material which has a different etch selectivity than the substrate material. If necessary, the protective layer is then anisotropically etched to remove portions of the protective layer which overlie the bottom of the shaped opening. Preferably, at least a portion of the substrate at the bottom of the shaped opening is exposed prior to proceeding with subsequent etching. The substrate is then further etched to a second predetermined depth to form a shaped cavity using an etchant gas which selectively etches the substrate relative to the protective layer.

One embodiment of the method of the invention is useful in semiconductor damascene processes and for etching trenches with embedded vessels, for example. Liquids can be guided along the trenches into the vessels. This embodiment of the invention makes use of a patterned etch barrier layer to guide the etching process. According to this embodiment, a patterned etch barrier layer is provided on an upper surface of a substrate. A portion of the upper substrate surface is exposed through the etch barrier layer. A layer of a fill material is then deposited over the etch barrier layer and the exposed upper substrate surface. A patterned masking layer is then provided on an upper surface of the fill material. A portion of the upper fill material surface is exposed through the masking layer. The fill material is then etched to a first predetermined depth to form a shaped opening. Etching is performed using an etchant gas which selectively etches the fill material relative to the etch barrier layer. This etching step exposes a sidewall of the fill material, an upper surface of the etch barrier layer, and a portion of an upper surface of the underlying substrate. A conformal protective layer is then formed over at least the sidewall of the shaped opening. The protective layer comprises a material having a different etch selectivity than the substrate and the fill material. If necessary, the protective layer is then anisotropically etched to remove portions of the protective layer which overlie the upper etch barrier layer surface and the upper substrate surface, exposing a portion of the upper substrate surface. The underlying substrate is then etched to a second predetermined depth to form a shaped cavity underlying the shaped opening, using an etchant gas which selectively etches the substrate relative to the protective layer and the etch barrier layer.

A second embodiment of the method of the invention is useful in the manufacture of vertical transistors, for example. This embodiment of the invention makes use of implanted etch stops to guide the etching process. According to this preferred embodiment, a single-crystal silicon substrate is provided. The single-crystal silicon substrate includes an implant of a material selected from the group consisting of an oxygen-comprising compound and a nitrogen-comprising compound, present at a first predetermined depth. A patterned masking layer is provided on an upper surface of the substrate. The masking layer is patterned such that the masking layer is aligned with the implanted material. A portion of the upper substrate surface is exposed through the masking layer. The substrate is then etched to a second predetermined depth to form a shaped opening using an etchant gas which selectively etches the substrate relative to the masking layer and the implanted material. The shaped opening is etched through areas of the substrate adjacent the implanted material, so that the bottom of the shaped opening is essentially coplanar with the bottom surface of the implanted material. A sidewall of the substrate and a sidewall of the implanted material are exposed during this etching step. A conformal protective layer is then formed overlying at least the exposed substrate sidewall and the exposed implanted material sidewall. The conformal protective layer comprises a material having a different etch selectivity than the substrate. If necessary, the protective layer is then anisotropically etched to remove portions of the protective layer which overlie the upper substrate surface. At least a portion of the upper substrate surface is exposed during this etching step. The underlying substrate is then etched to a third predetermined depth to form a shaped cavity, using an etchant gas which selectively etches the substrate relative to the protective layer.

A third embodiment of the method of the invention results in the formation of a double spherical profile useful as a cantilever for an accelerometer, for example. This embodiment of the invention makes use of a lateral (unpatterned) etch barrier layer to guide the etching process. According to this preferred embodiment, a film stack comprising, from top to bottom, a layer of a fill material and an etch barrier layer, is provided on an upper surface of a substrate. The fill material is then etched to a first predetermined depth to form a shaped opening. A conformal protective layer is then formed overlying at least the sidewall of the shaped opening. The conformal protective layer comprises a material having a different etch selectivity than the fill material. If necessary, the protective layer is then etched to remove portions of the protective layer which overlie the bottom of the shaped opening. At least a portion of the underlying fill material at the bottom of the opening is exposed. The underlying fill material is then isotropically etched to a second predetermined depth to form a shaped cavity, using an etchant gas which selectively etches the fill material relative to the protective layer and the etch barrier layer. An upper surface of the etch barrier layer is exposed.

An fourth, alternative embodiment of the third embodiment described above makes use of multiple lateral etch barrier layers to guide the etching process. According to this embodiment, a film stack comprising, from top to bottom, a first layer of a fill material, a first etch barrier layer, a second layer of a fill material, and a second etch barrier layer, is provided on an upper surface of a substrate. The first fill material is then etched to a first predetermined depth to form a shaped opening. Etching is performed using an etchant gas which selectively etches the first fill material relative to the first etch barrier layer. An upper surface of the first etch barrier layer is exposed during this etching step. A conformal protective layer is then formed on at least the sidewall of said shaped opening. The protective layer comprises a material having a different etch selectivity than the first fill material and the second fill material. The first etch barrier layer is then anisotropically etched to remove the portion of the first etch barrier layer at the bottom of the shaped opening. If necessary, portions of the protective layer overlying the first etch barrier layer at the bottom of the shaped opening are also removed during this etching step. At least a portion of the underlying second fill material is exposed. The underlying second fill material is then isotropically etched to a second predetermined depth to form a shaped cavity, using an etchant gas which selectively etches the second fill material relative to the protective layer and the second etch barrier layer. An upper surface of the second etch barrier layer is exposed.

As discussed above, the method of the invention is useful in many different applications. One such application is the manufacture of semiconductor devices having small feature sizes. A multi-part cavity may be formed in a substrate as a part of a semiconductor device. In one preferred embodiment, a patterned film stack comprising, from top to bottom, at least one masking layer, at least one etch barrier layer, and at least one gate dielectric layer, is provided on an upper surface of a semiconductor substrate. A portion of the upper substrate surface is exposed through the masking layer, the etch barrier layer, and the gate dielectric layer. The substrate is etched to a first predetermined depth to form a shaped opening. A conformal protective layer is then formed overlying at least the sidewall of the shaped opening. The protective layer comprises a material having a different etch selectivity than the substrate. If necessary, the protective layer is then anisotropically etched to remove portions of the protective layer which overlie the masking layer and the bottom of the shaped opening. At least a portion of the underlying substrate at the bottom of the shaped opening is exposed. The underlying substrate is then etched to a second predetermined depth to form a shaped cavity, using an etchant gas which selectively etches the substrate relative to the protective layer.

In another embodiment of the above method of the invention, a patterned film stack comprising, from top to bottom, at least one silicon oxide masking layer, at least one silicon nitride etch barrier layer, and at least one silicon oxide gate dielectric layer, is provided on an upper surface of a semiconductor substrate. The underlying substrate is then anisotropically etched to a first predetermined depth to form a shaped opening in the substrate. A conformal protective layer is then formed overlying at least the sidewall of the shaped opening. The protective layer comprises a material having a different etch selectivity than the substrate. The protective layer is then anisotropically etched to remove the portions of the protective layer which overlie the masking layer and the bottom of the shaped opening. At least a portion of the underlying substrate at the bottom of the shaped opening is exposed during this etching step. The underlying substrate is then etched to a second predetermined depth to form a shaped cavity using an etchant gas which selectively etches the substrate relative to the protective layer.

One embodiment of the above method provides an improvement over the known art pertaining to forming a trench capacitor in a single-crystal silicon substrate. According to this embodiment, a patterned film stack comprising, from top to bottom, at least one silicon oxide masking layer, at least one silicon nitride etch barrier layer, and at least one silicon oxide gate dielectric layer is provided on an upper surface of a single-crystal silicon substrate. A sidewall of the etch barrier layer, a sidewall of the gate dielectric layer, and a portion of the upper substrate surface are exposed through the masking layer, the etch barrier layer, and the gate dielectric layer. The single-crystal silicon substrate is then etched to a first predetermined depth to form a shaped opening. A conformal protective layer comprising silicon oxide is then formed overlying at least the sidewall of the shaped opening. If necessary, the protective layer is then anisotropically etched to remove portions of the protective layer which overlie the masking layer and the bottom of the shaped opening. At least a portion of the underlying single-crystal silicon substrate at the bottom of the shaped opening is exposed during this etching step. The underlying single-crystal silicon substrate is then etched to a second predetermined depth to form a shaped cavity using an etchant gas which selectively etches the single-crystal silicon substrate relative to the protective layer. A conformal dielectric film is then formed overlying the remaining masking layer, the protective layer, and the sidewalls and bottom of the shaped cavity. The shaped cavity and the shaped opening are then filled with polysilicon. The polysilicon is then isotropically etched back to a third predetermined depth within the shaped opening. A wet etch step is then performed to remove the remaining masking layer, the upper part of the conformal dielectric film, and the upper part of the protective layer to a fourth predetermined depth. The shaped opening is then refilled with polysilicon, then isotropically etched to remove the polysilicon to a fifth predetermined depth within the shaped opening. In this etching step, a portion of the single-crystal silicon substrate is also removed from the top portion of the sidewall of the shaped opening above the protective layer, to form a buried strap.

In each of the embodiments described above, the shaped cavity directly underlies and is in continuous communication with the shaped opening, and the protective layer effectively preserves the profile of the shaped opening during etching of the shaped cavity.

In U.S. application Ser. No. 09/144,088 of Lill et al., a trench capacitor is etched in a single-crystal silicon substrate to meet specifications dictated by the electrical requirements of the device being fabricated. The method of the present invention provides an alternative method for device fabrication having fewer steps than disclosed in the Lill et al. application.

Also disclosed herein is a method of protecting a silicon nitride etch barrier layer and an exposed upper sidewall of a single-crystal silicon substrate during etching. According to this method, at least one silicon nitride etch barrier is provided on an upper surface of single-crystal silicon substrate. The silicon nitride etch barrier layer has been patterned, exposing a sidewall of the silicon nitride etch barrier layer and a portion of the upper sidewall of the substrate. The exposed silicon nitride sidewall and exposed upper substrate sidewall are then oxidized, forming a thin oxidized coating over the exposed silicon nitride sidewall and upper substrate sidewall.

BRIEF DESCRIPTION OF THE DRAWINGS

FIG. 2A shows a beginning structure 200 for practicing the general method of the invention. This structure is a shaped opening 204 etched in a substrate 202 to a first predetermined depth A.

FIG. 2B shows the structure of FIG. 2A following formation of a conformal protective layer 206 on the sidewall 208 and bottom 210 of shaped opening 204.

FIG. 2C shows the structure of FIG. 2B after the protective layer has been isotropically etched to remove a portion of the protective layer which overlies the bottom 208 of shaped opening 204.

FIG. 2D shows the structure of FIG. 2C after the underlying substrate 202 has been etched to a second predetermined depth B to form a shaped cavity 212 which underlies shaped opening 204.

FIG. 2E shows a structure 220 comprising a shaped cavity 226 underlying a shaped opening 224 following deposition of a conformal layer of fill material 228. The conformal layer of fill material 226 is deposited to have a thickness A on all surfaces which is equal to at least one-half of the width of the shaped opening 224, in order to completely occlude the shaped opening 224. FIG. 2F shows a resulting structure when the layer of fill material 228 (shown in FIG. 2E) comprises the same material as the substrate 222.

FIG. 5A shows a beginning structure 500 for practicing this preferred embodiment. This structure is an etch barrier layer 504 overlying an upper surface of a substrate 502. A portion 506 of a surface of the underlying substrate 502 is exposed through etch barrier layer 504.

FIG. 5B shows the structure of FIG. 5A following deposition of a layer 508 of a fill material.

FIG. 5C shows the structure of FIG. 5B after deposition and patterning of a masking layer 510. A portion 512 of a surface of the underlying fill material 508 has been exposed through masking layer 510.

FIG. 5D shows the structure of FIG. 5C after a shaped opening 514 has been etched in the fill material 508. The top surface and sidewall of masking layer 510, the sidewall 520 of the fill material 508, an upper surface 516 of the etch barrier layer 504, and a portion 518 of an upper surface of the underlying substrate 502 are exposed.

FIG. 5E shows the structure of FIG. 5D after formation of a conformal protective layer 522 over the upper surface and sidewall of masking layer 510, the exposed fill material sidewall 520, the exposed etch barrier layer surface 516, and the exposed substrate surface 518.

FIG. 5F shows the structure of FIG. 5E after anisotropically etching to remove the portion of the protective layer 522 which overlies the etch barrier layer 504 and the substrate 502, and after etching of a shaped cavity 524 into the underlying substrate 502.

FIG. 6A shows a beginning structure 600 for practicing this preferred embodiment. This structure is a patterned masking layer 606 overlying an upper surface of a substrate 602. A portion 608 of a surface of the underlying substrate 602 is exposed through masking layer 606. A material 604 (such as an oxygen-comprising compound or a nitrogen-comprising compound) has been implanted to, or created at, a first predetermined depth within the substrate 602.

FIG. 6B shows the structure of FIG. 6A after a shaped opening 610 has been etched in the substrate 602 to a first predetermined depth, which extends to the bottom surface or base of the implanted material 604. A sidewall 612 of the substrate 602, a surface and top sidewall of the patterned masking layer 606, a sidewall 614 of the implanted material 604, and a portion 616 of a surface of the underlying substrate 602 are exposed.

FIG. 6C shows the structure of FIG. 6B after formation of a conformal protective layer 618 on the exposed substrate sidewall 612, the exposed implanted material sidewall 614, and the exposed substrate surface 616.

FIG. 6D shows the structure of FIG. 6C after anisotropically etching to remove the portion of the protective layer 618 overlying the substrate surface 616, and after etching of a shaped cavity 620 into the underlying substrate 602.

FIG. 7A shows a beginning structure 700 for practicing this preferred embodiment. This structure 700 includes the following layers, from top to bottom, a patterned masking layer 703, a layer 704 of a fill material, and an etch barrier layer 706, all deposited on substrate 702.

FIG. 7B shows the structure of FIG. 7A after a shaped opening 708 has been etched in the fill material layer 704 to a first predetermined depth.

FIG. 7C shows the structure of FIG. 7B after formation of a conformal protective layer 710 on the sidewall 709 and bottom 711 of the shaped opening 708.

FIG. 7D shows the structure of FIG. 7C after anistropically etching to remove the portion of the protective layer 710 overlying the bottom 711 of the shaped opening 708. A portion of the underlying fill material 704 at the bottom 711 of the shaped opening 708 is exposed during this step.

FIG. 7E shows the structure of FIG. 7D after a shaped cavity 712 has been etched in the exposed fill material 704 to a second predetermined depth. An upper surface of lateral etch barrier layer 706 is exposed during this step and prevents further downward etching of the shaped cavity 708 into the substrate 702. The double spherical profile shown in FIG. 7E is obtained by continued isotropic etching of closely adjacent shaped cavities, in order to remove the fill material between the shaped cavities.

FIG. 7F shows a beginning structure 720 for practicing this preferred embodiment. This structure 720 includes the following layers, from top to bottom, a patterned masking layer 723, a first layer 724 of a fill material, a first etch barrier layer 726, a second layer 728 of a fill material, and a second etch barrier layer 730, all deposited on substrate 702.

FIG. 7G shows the structure of FIG. 7F after a shaped opening 732 has been etched in the first fill material layer 724 to a first predetermined depth.

FIG. 7H shows the structure of FIG. 7G after formation of a conformal protective layer 734 on the sidewall 731 and bottom 733 of the shaped opening 732.

FIG. 7I shows the structure of FIG. 7H after anistropically etching to remove the portion of the protective layer 734 and the first etch barrier layer 726 overlying the bottom 733 of the shaped opening 732. A portion of the second fill material 728 at the bottom 733 of the shaped opening 732 is exposed during this step.

FIG. 7J shows the structure of FIG. 7I after a shaped cavity 736 has been etched in the second fill material 728 to a second predetermined depth. An upper surface of second etch barrier layer 730 is exposed during this step and prevents further downward etching of the shaped cavity 732 into the substrate 722. The double spherical profile shown in FIG. 7J is obtained by continued isotropic etching of closely adjacent shaped cavities, in order to remove the fill material between the shaped cavities.

FIG. 8A shows a beginning structure 800 for practicing this preferred embodiment method of the invention. This structure is a patterned film stack 810 overlying an upper surface of a single-crystal silicon substrate 802. The patterned film stack 810 includes a gate dielectric layer 804 overlying an upper surface 803 of the silicon substrate 802, a silicon nitride etch barrier layer 806 overlying the gate dielectric layer 804, and a silicon oxide masking layer 808 overlying the etch barrier layer 806. The film stack 810 was patterned using a conventional photoresist 812. A portion 805 of an upper surface of the silicon substrate 802 is exposed.

FIG. 8G shows the structure of FIG. 8F after formation of a conformal dielectric layer 824 over the remaining silicon oxide masking layer 808, the protective layer 820, and the sidewall 821 and bottom 823 of the shaped cavity 822.

FIG. 8H shows the structure of FIG. 8G after filling of the shaped cavity 822 and the shaped opening 818 with a layer 826 of polysilicon.

FIG. 8N shows the structure of FIG. 8M after etchback of the polysilicon layer 828 to a predetermined depth E and removal of a portion of the single-crystal silicon substrate 802 from the top portion of the sidewall above the protective layer 820, in order to form a buried strap 832. The doped polysilicon in the region of the buried strap is indicated by stippling in FIGS. 8L–8N.

DETAILED DESCRIPTION OF THE INVENTION

Figure 1A:
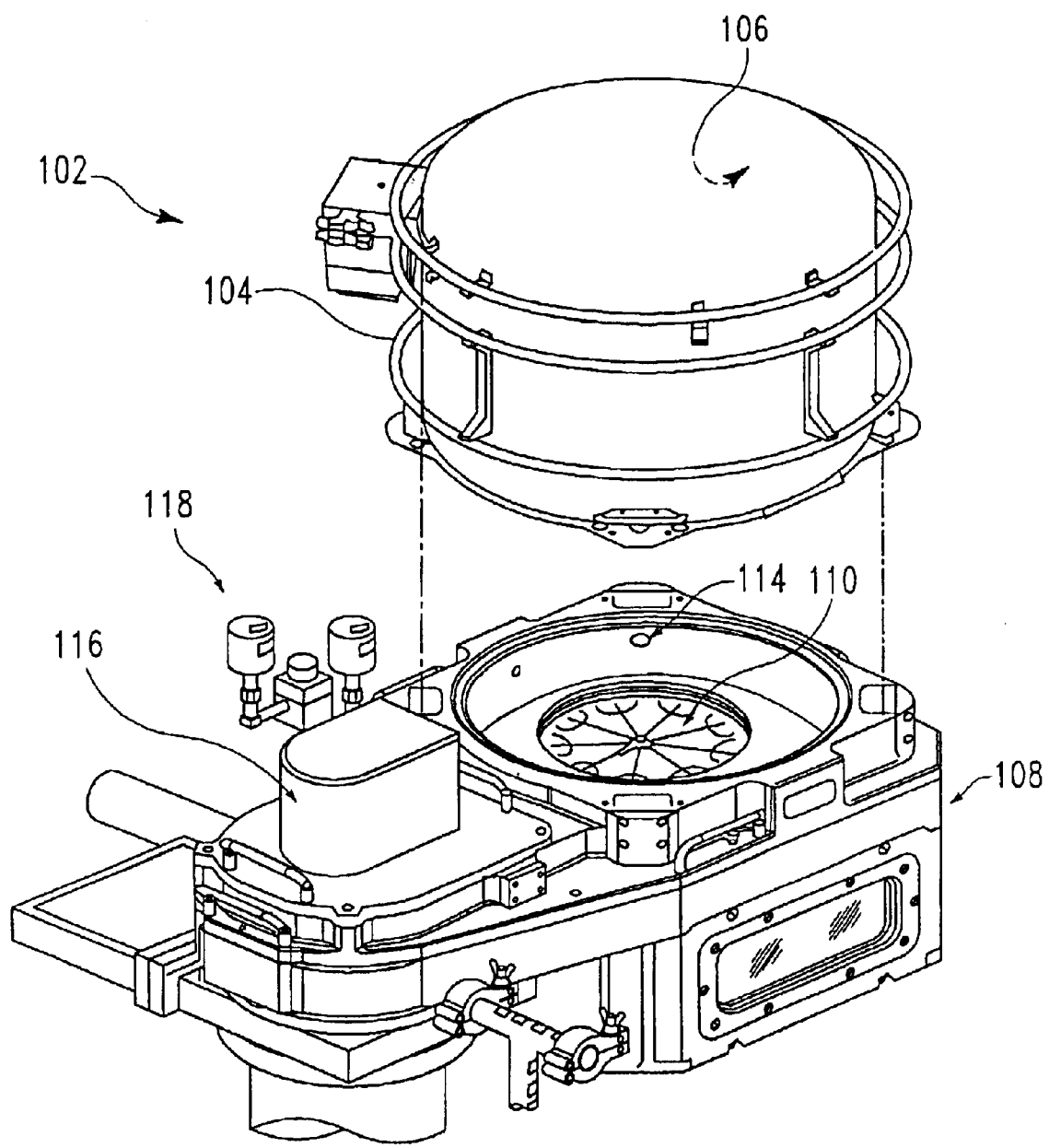
FIGS. 1A and 1B are schematics of an individual polysilicon etch chamber of the type used in an Applied Materials' CENTURA® DPS™ polysilicon etch system, which is a preferred example of an etch processing apparatus for performing the method of the invention.

The present invention is a method that allows the formation of a multi-part cavity in a substrate, wherein the shaped opening is protected from etching during formation of the underlying shaped cavity, allowing the shaped opening and the underlying shaped cavity to be etched to have different shapes.

I. DEFINITIONS

As a preface to the detailed description, it should be noted that, as used in this specification and the appended claims, the singular forms "a", "an", and "the" include plural referents, unless the context clearly dictates otherwise. All percentages (%) listed for gas constituents are % by volume, unless otherwise indicated.

Specific terminology of particular importance to the description of the present invention is defined below.

The term "anisotropic etching" refers to etching which does not proceed in all directions at the same rate. If etching proceeds exclusively in one direction (e.g., only vertically), the etching process is said to be completely anisotropic.

The term "aspect ratio" refers to the ratio of the height dimension to the width dimension of particular openings. For example, a via opening which typically extends in a tubular form through multiple layers has a height and a diameter, and the aspect ratio would be the height of the tubular divided by the diameter. The aspect ratio of a trench would be the height of the trench divided by the average minimal width of the trench.

The term "cavity" refers to any three-dimensional depression in a substrate, including, for example, trenches and contact vias.

The term "etch front" refers to the shape of the leading edge of the surface being etched. For example, the etch front may be substantially flat (i.e., horizontal), or it may, for example, have a V-shape, W-shape, U-shape, or ∩-shape.

The term "etch profile" (or "feature profile") generally refers to, but is not limited to, the cross-sectional profile of the sidewall of an etched feature. In many instances herein, the etch profile is described in terms of an angle between the sidewall and the surface on which the feature stands (i.e., the substrate). The term "vertical profile" refers to a feature profile wherein a cross-section of the feature exhibits sidewalls which are essentially perpendicular to the surface on which the feature stands. The term "positive profile" (also known as an "undercut" profile) refers to a feature profile wherein the width of the cross-section of the feature is larger as the distance away from the opening increases. The term "negative profile" (also known as a "tapered" profile) refers to a feature profile wherein the width of the cross-section of the feature is smaller as the distance away from the opening increases.

The term "etch selectivity" may be used to refer to: a) a ratio of etch rate of one material to the etch rate of another material; or b) a condition achieved during etch when etch rate of one material is increased in comparison with the etch rate of another material.

The term "feature" refers to, but is not limited to, contacts, vias, trenches, and other structures which make up the topography of the substrate surface.

The term "feature size" typically refers to the smallest dimension of a feature (i.e., the shortest distance between the sidewalls of a feature).

The term "high densityplasma" refers to a plasma having a density of about $1 \times 10^{11}$ $e^-/cm^3$, or greater.

The term "isotropic etching" refers to an etching process where etching can proceed in all directions at once, with roughly the same etch rate.

The term "polysilicon" refers to polycrystalline silicon and to doped polycrystalline silicon.

The term "recess etch" refers to, but is not limited to, a process wherein a material (such as polysilicon) which has been previously deposited onto a topography on a substrate surface is etched back to a predetermined depth within a recess in the topography.

The term "substrate" refers to any material which can be etched.

II. APPARATUS FOR PRACTICING THE INVENTION

The method of the invention is preferably performed in a plasma etching apparatus that is capable of both anisotropic and isotropic etching, and is capable of easily switching back and forth between the two types of etching. An example of such an apparatus is the CENTURA® DPS™ polysilicon etch system, available from Applied Materials, Santa Clara, Calif.

Figure 1B:
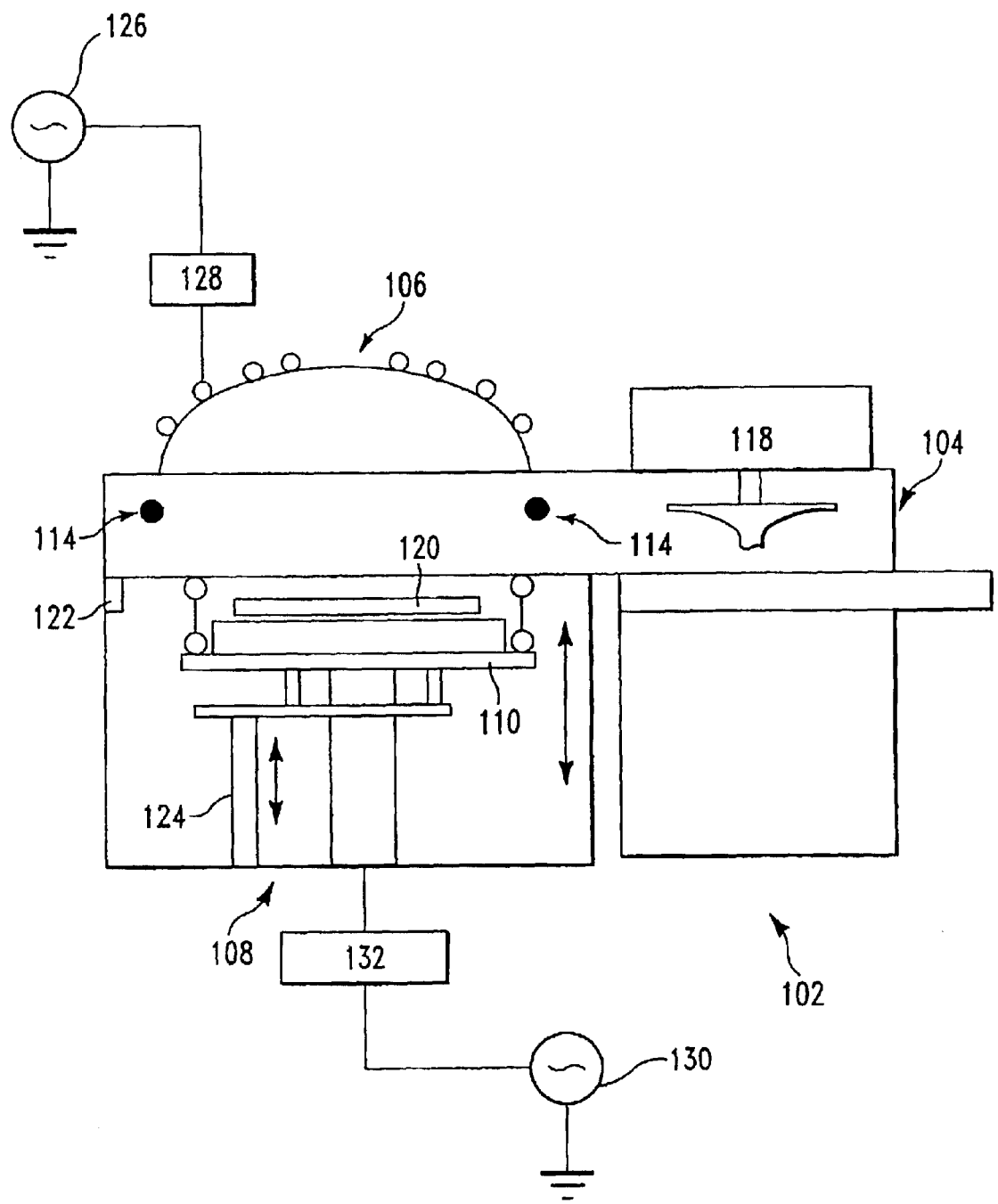

FIGS. 1A and 1B are schematics of an individual CENTURA® DPS™ polysilicon etch chamber 102 of the type used in the Applied Materials' CENTURA® polysilicon etch system. The CENTURA® DPS™ polysilicon etch chamber 102 is configured to be mounted on a standard CENTURA® 5200 etch mainframe. The polysilicon etch chamber 102 consists of an upper chamber 104 having an internal ceramic dome 106, and a lower chamber 108. The lower chamber 108 includes a monopolar electrostatic chuck (ESC) cathode 110. Gas is introduced into the chamber via four ceramic gas injection nozzles 114. Chamber pressure is controlled by a closed-loop pressure control system 118 with a throttle valve (not shown, but interior to casing 116).

FIG. 1B shows a cross-sectional side view of a polysilicon etch chamber 102. During processing, a substrate 120 is introduced into the lower chamber 108 through inlet 122. The substrate 120 is held in place by means of a charge generated on the surface of electrostatic chuck (ESC) cathode 110 by applying a DC voltage to a conductive layer located under a dielectric film on the chuck surface. The cathode 110 and substrate 120 are then raised by means of a wafer lift 124 and sealed against the upper chamber 104 in position for processing. Etch gases are introduced into the upper chamber 104 via the ceramic gas injection nozzles 114. The polysilicon etch chamber 102 uses an inductively coupled power source 126 at a frequency typically of about 12.56 MHZ for generating and sustaining a high density plasma. The wafer may be biased using an RF source 130 at a frequency typically of about 13.56 MHZ. Power to the plasma-generating power source 126 and substrate biasing means 130 are controlled by separate controllers, 128 and 132, respectively.

An endpoint subsystem (not shown) senses the end of the etch process by monitoring changes in the light emitted by the plasma in the etch chamber 102. The standard CENTURA® DPS™ endpoint system consists of a monochromator and photomultiplier tube which automatically endpoints all etch chambers. A fiber optic cable routes light from a recessed quartz window on the chamber to the monochromator or an optional HOT™ pack photomultiplier available from Applied Materials, Inc. When the monochromator is used, light is shone into a motor-driven concave grating. Light is then reflected onto the entrance slit on the photomultiplier tube, which amplifies the light. This data is then displayed on a PC monitor. The operator sets an algorithm which controls the endpoint system. Overetching can be programmed to start either as the film begins to clear or when it has cleared completely. The endpoint time can be adjusted by changing the number of windows that the signal must exit to endpoint. The endpoint wavelength is programmable for each process step. An appropriate endpoint wavelength is selected depending on the films being etched.

III. GENERAL METHODS FOR FORMING A MULTI-PART CAVITY IN A SUBSTRATE

According to the general method of the invention, a shaped opening is formed in a substrate, then the profile (i.e., shape) of the shaped opening is preserved by the formation of a protective layer over inner surfaces of the shaped opening, followed by etching of an underlying shaped cavity, which may have a different shape than the shaped opening. Formation of the protective layer prevents the etch profile of the shaped opening from being affected during subsequent etching of the shaped cavity.

Figure 2A:
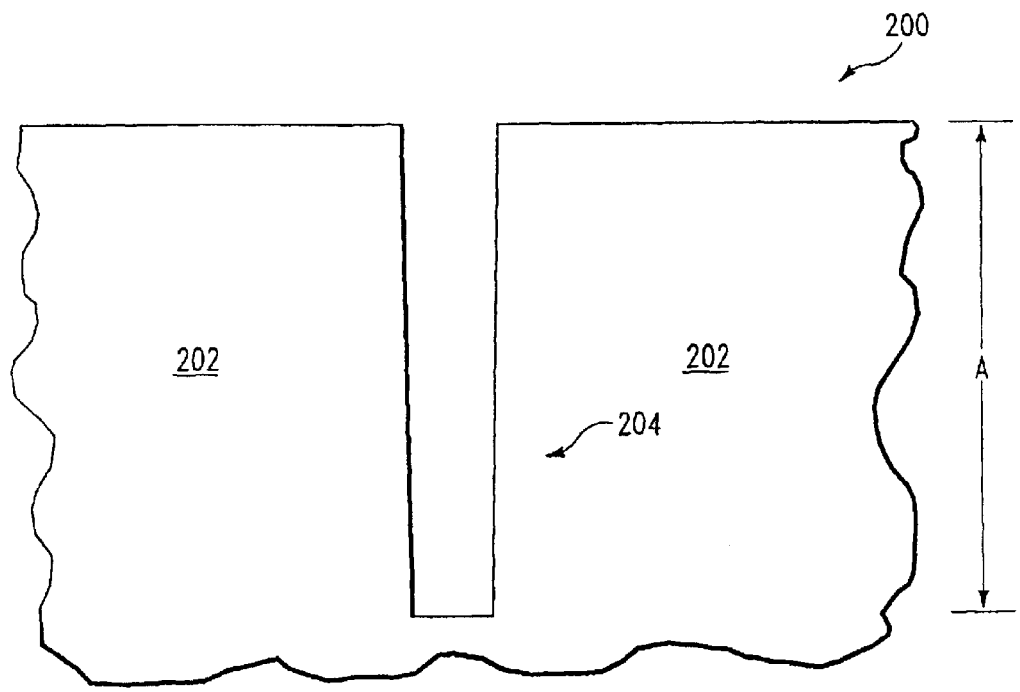
FIGS. 2A–2D illustrate the general method of the invention.

FIGS. 2A–2D illustrate the general method of the invention. Referring to FIG. 2A, a shaped opening 204 is etched in a substrate 202 to a first predetermined depth A using etching techniques known in the art, depending on the substrate material. The substrate 202 may comprise any material which can be etched using etching techniques known in the art. The substrate material may be, for example and not by way of limitation, single-crystal silicon, silicon dioxide, silicon nitride, aluminum, polyimide, SILK™, FLARE™, diamond, and di-vinyl siloxane benzocyclobutene (BCB).

Figure 2B:
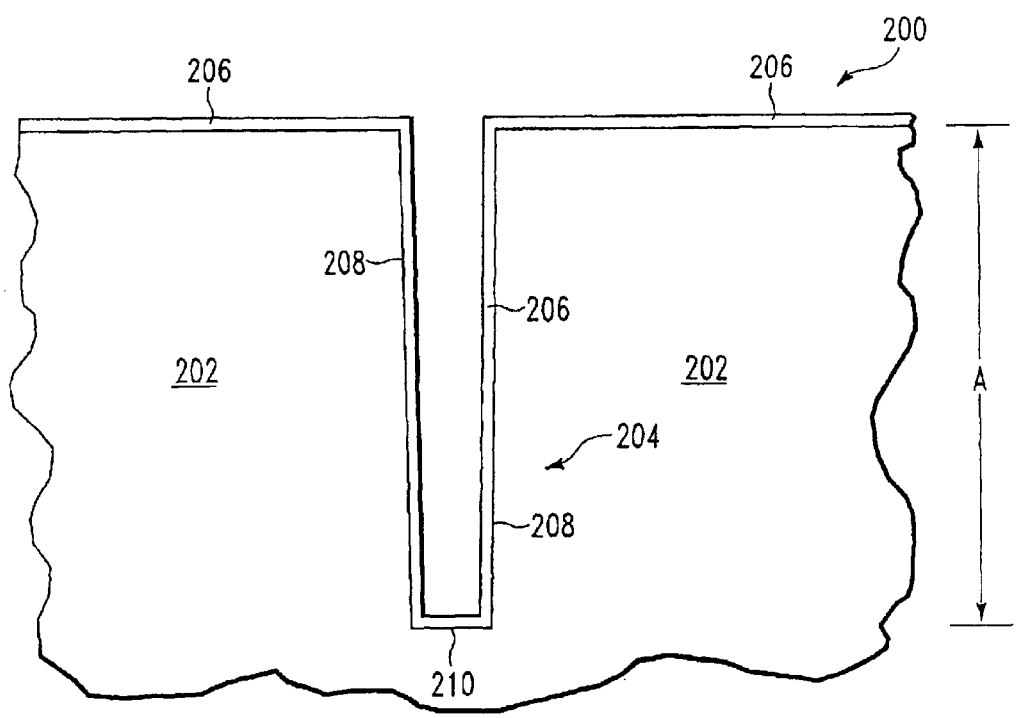

Referring to FIG. 2B, a conformal protective layer 206 is then formed on at least the sidewall 208 of the shaped opening 204 using techniques known in the art, depending on the composition of the protective layer. Typically, the protective layer 206 is also formed on the bottom 210 of the shaped opening; however, in certain situations, such as for very high aspect ratio (greater than about 50:1) shaped openings, the protective layer 206 may not be deposited on the bottom 210 of the shaped opening.

The conformal protective layer is deliberately formed on interior surfaces of the opening, as distinguished from protective layers made up of reaction byproducts which are incidentally deposited during various processing steps. The purpose of the protective layer is to preserve the profile of the shaped opening during etching of the underlying shaped cavity.

The protective layer 206 comprises a material having a different etch selectivity than the substrate. The protective layer may comprise, but is not limited to, silicon oxide, silicon nitride, silicon oxynitride, polysilicon, titanium nitride, diamond, polyimide, and aluminum.

The protective layer material selected will depend upon the substrate material. For example, and not by way of limitation, if the substrate comprises single-crystal silicon, the protective layer is frequently selected to comprise a material selected from the group consisting of silicon oxide, silicon nitride, silicon oxynitride, titanium nitride, aluminum, diamond, polyimide, and combinations thereof. Silicon oxide and silicon nitride work particularly well. If the substrate comprises silicon oxide, the protective layer is frequently selected to comprise a material selected from the group consisting of polysilicion, silicon nitride, titanium nitride, aluminum, diamond, polyimide, and combinations thereof. Polysilicon and silicon nitride work particularly well. If the substrate comprises silicon nitride, the protective layer is frequently selected to comprise a material selected from the group consisting of polysilicon, silicon oxide, titanium nitride, aluminum, diamond, polyimide, and combinations thereof. Polysilicon and silicon oxide work particularly well. If the substrate comprises aluminum, the protective layer is frequently selected to comprise a material selected from the group consisting of polyimide, titanium nitride, silicon oxide, silicon nitride, and combinations thereof. Silicon oxide and silicon nitride work particularly well. If the substrate comprises polyimide or SILK™ (an organic polymer polyarylene ether based similar to BCB which does not contain silicon, available from Dow Chemical Co.) or FLARE™ (polyarylene ether based, available from Allied Signal) or BCB (divinylsiloxane bis-benzocyclobutene), the protective layer is frequently selected to comprise a material selected from the group consisting of silicon oxide, silicon nitride, aluminum, titanium nitride, and combinations thereof. Silicon oxide and silicon nitride work particularly well. One skilled in the art can select other materials as substrates and protective layers, keeping in mind the need for various etch selectivities between the materials.

The protective layer 206 is typically formed to have a thickness of at least several atomic layers on interior surfaces of the shaped opening 204. The thickness of the protective layer is typically within the range of about 10 Å to about 500 Å. The thickness of the protective layer depends on a number of factors, including, but not limited to, the composition of the protective layer, the composition of the substrate, the feature size and aspect ratio of the shaped opening, and the process chemistry and conditions of subsequent etch steps. The required protective layer thickness for a particular application can be determined with minimal experimentation.

Figures 2C, 2D:
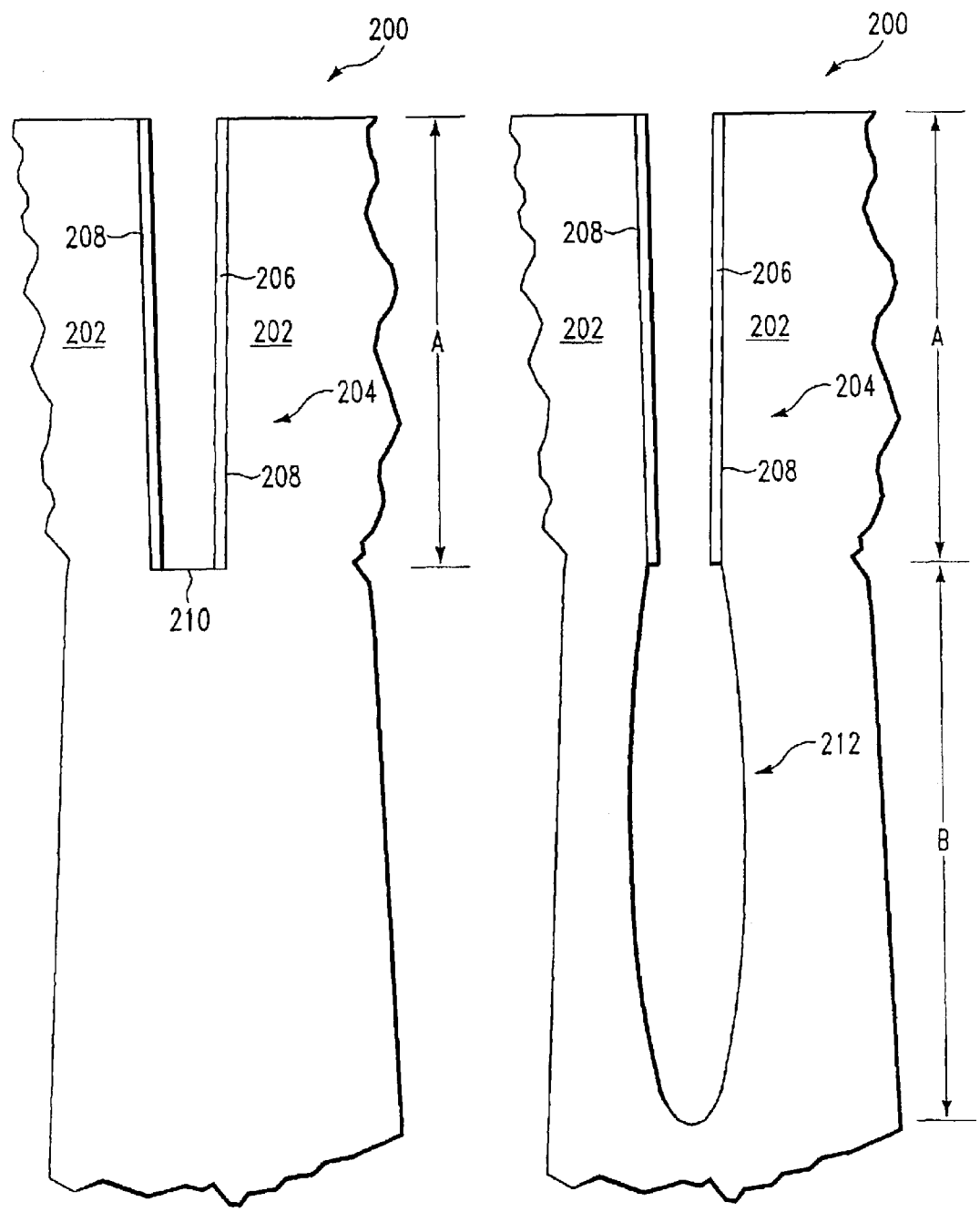

Referring to FIG. 2C, the protective layer 206 is then anistropically etched to remove portions of the protective layer which overlie the bottom 208 of the shaped opening 204, if necessary. Anisotropic etching is performed using any suitable apparatus and techniques known in the art. A portion of the underlying substrate 202 at the bottom 208 of the shaped opening 204 is exposed during this step.

Referring to FIG. 2D, a shaped cavity 212 is then etched in the underlying substrate 202 to a second predetermined depth B. The shaped cavity 212 directly underlies and is in continuous communication with the shaped opening 204. The shaped cavity 212 is etched using an etchant gas which selectively etches the substrate relative to the protective layer (i.e., the etchant gas etches the substrate at a much faster rate than the protective layer), such that the protective layer effectively preserves the profile of the shaped opening during etching of the shaped cavity, allowing the shaped cavity to be etched to have a different shape than the shaped opening, if so desired. For example, a portion of the cross-sectional dimension of the shaped cavity 212 which is on a plane parallel with the upper surface of the substrate 202 is larger than the largest cross-sectional dimension of the shaped opening 204 is parallel with the upper surface of substrate 202.

If a multi-part cavity having three or more parts is desired, a second protective layer can be deposited over the first protective layer and the sidewall and bottom of the shaped cavity, as described above. If necessary, portions of the second protective layer overlying the bottom of the shaped cavity can then be removed by etching, as described above, in order to expose at least a portion of the substrate at the bottom of the shaped cavity. A second shaped cavity can then be etched in the substrate as described above, with the second protective layer preserving the profile of both the shaped opening and the first shaped cavity during etching of the second shaped cavity. The above process may be repeated for third, fourth, etc. shaped cavities, if so desired, to form a multi-layered structure.

The general method of the invention is useful in many different applications. The method of the invention can be applied to any application where it is necessary or desirable to provide a structure having a shaped opening and an underlying shaped cavity having varying shapes, and where it is necessary to maintain tight control over the dimensions of the shaped opening. For example, the method of the invention can be used for micromachining of test chips for performance of various chemical or biological assays (e.g., genome testing), wherein the testing reagents would be contained in a plurality of shaped cavities etched in the chip. The method of the invention can also be used for micromachining of electrostatically controlled nozzles for use in inkjet printers, wherein the ink would be contained in the shaped cavity and the shaped opening would function as a nozzle. The method of the invention allows for excellent control over the critical dimensions of the shaped opening (e.g., the diameter of the nozzle), providing for consistent and reproducible micromachining of a variety of devices. Adapting the general method of the invention for use in a particular application will be within the capability of one skilled in the art to which that particular application belongs, without the need to perform undue experimentation.

Figure 2E:
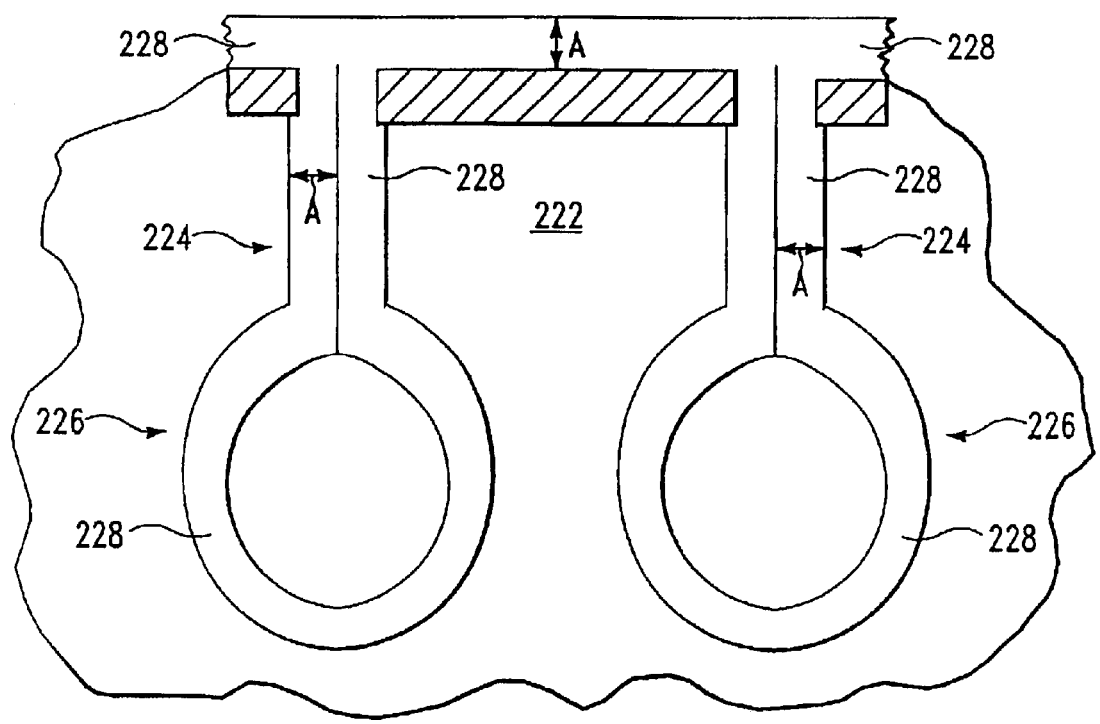
FIGS. 2E and 2F illustrate an embodiment of the general method of the invention in which a conformal layer of a fill material is deposited over interior surfaces of the shaped opening in order to seal off the shaped opening.
Figure 2F:
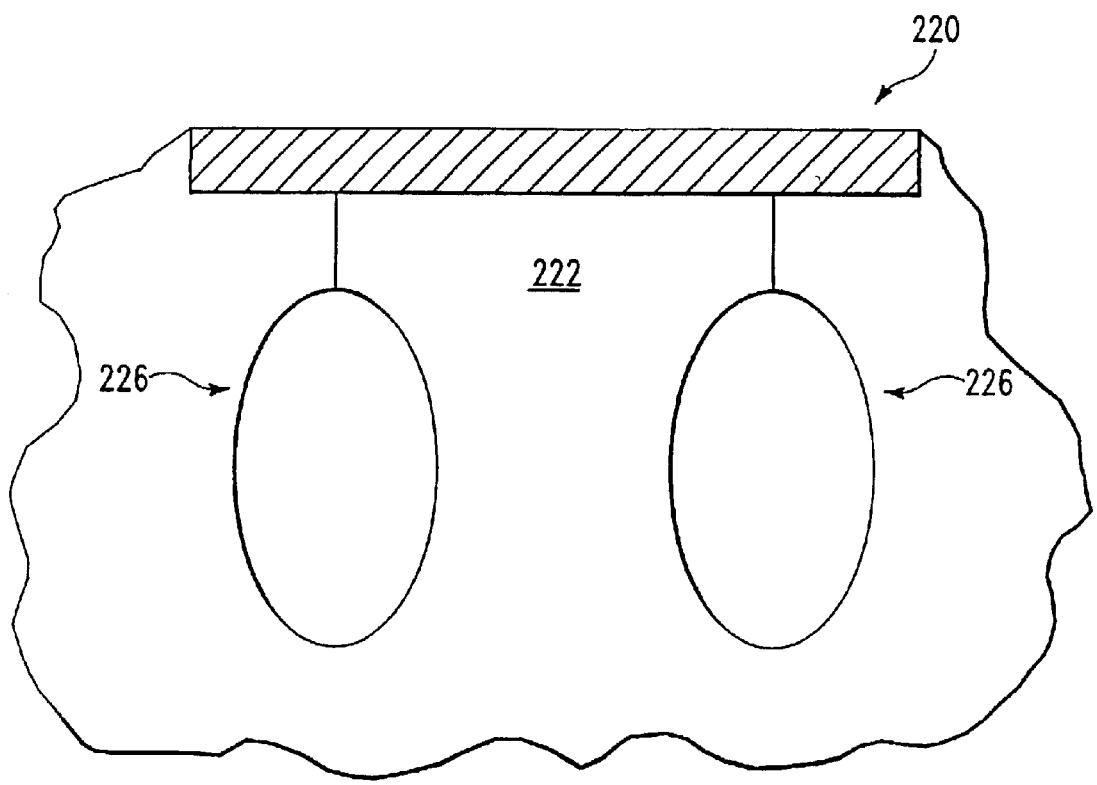
Figure 3A:
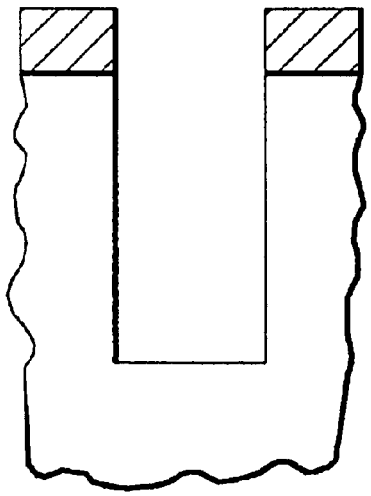
FIG. 3 shows examples of various shaped opening profiles that can be obtained using the general method of the invention: (A) vertical; (B) positive slope; C) negative slope; and (D) curved.
Figure 3B:
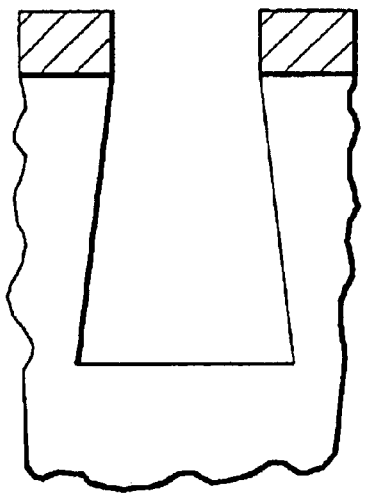
Figure 3C:
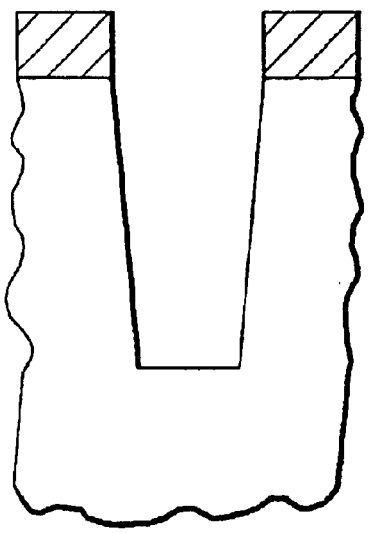
Figure 3D:
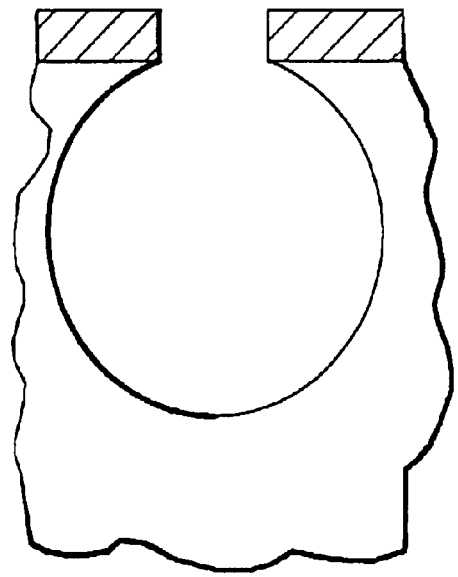

FIGS. 2E and 2F illustrate an embodiment of the general method of the invention which is useful in waveguides and buried tubes, for example. In this embodiment of the invention, a conformal layer of a fill material 228 is deposited over interior surfaces of the shaped opening 224. The protective layer (not shown) is typically removed, using techniques known in the art, prior to deposition of the fill material 228. FIG. 2E shows a structure 220 comprising a shaped cavity 226 underlying a shaped opening 224 following removal of the protective layer and deposition of a conformal layer of fill material 228. The conformal layer of fill material 228 is deposited, using conformal deposition techniques known in the art, to have a thickness "A" on all surfaces which is equal to at least one-half of the width of the shaped opening 224, in order to completely occlude the shaped opening 224. The shaped cavity 226 has a cross-sectional dimension in a plane parallel to the upper surface of the substrate which is greater than the cross-sectional dimension of the shaped opening 224 in a plane parallel to the upper surface of the substrate, so that a cavity remains in the center of shaped cavity 226 after occlusion of the shaped opening 224, as illustrated in FIG. 2E.

FIG. 2F shows a final structure when the layer of fill material 228 (shown in FIG. 2E) comprises the same material as the substrate 222. If the fill material 228 is the same material as the substrate 222, the protective layer may be removed prior to deposition of the fill material 228, in order to provide a continuous plug of substrate/fill material.

The substrate/fill material may comprise any material which can be deposited conformally and etched using etching techniques known in the art. The substrate/fill material may be, for example and not by way of limitation, silicon, silicon dioxide, silicon nitride, aluminum, polyimide, SILK™, FLARE™, diamond, and di-vinyl siloxane benzocyclobutene (BCB).

FIG. 3 shows examples of various shaped opening profiles that can be obtained using the general method of the invention: (A) vertical; (B) positive slope; (C) negative slope; and (D) curved.

FIG. 4 shows examples of various shaped cavity profiles that can be obtained using the general method of the invention: (A) spherical; (B) positive slope conical; (C) negative slope conical; (D) horizontal elliptical; (E) vertical elliptical; and (F) double spherical. The shaped cavity profiles shown in FIGS. 4A–F are useful as vessels for microchemistry and genome sequencing, for example.

Figure 4A:
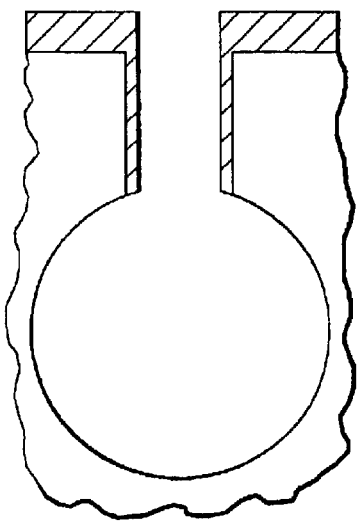
FIG. 4 shows examples of various shaped cavity profiles that can be obtained using the general method of the invention: (A) spherical; (B) positive slope conical; C) negative slope conical; (D) horizontal elliptical; (E) vertical elliptical; and (F) double spherical.
Figure 4B:
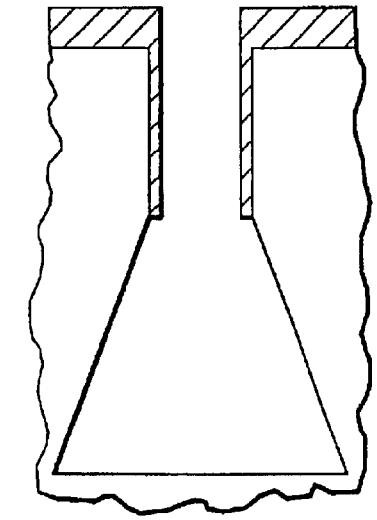
Figure 4C:
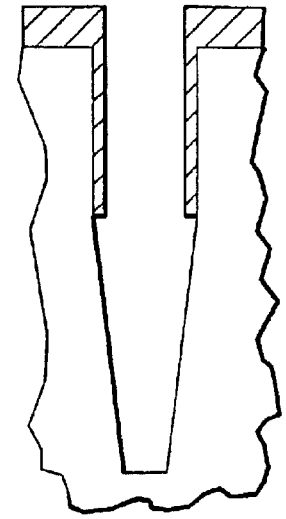
Figure 4D:
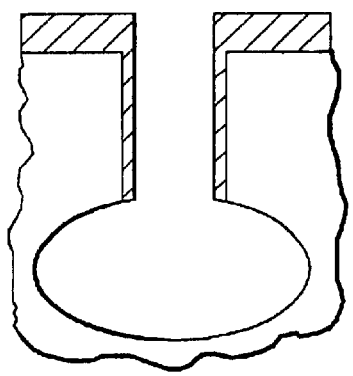
Figure 4E:
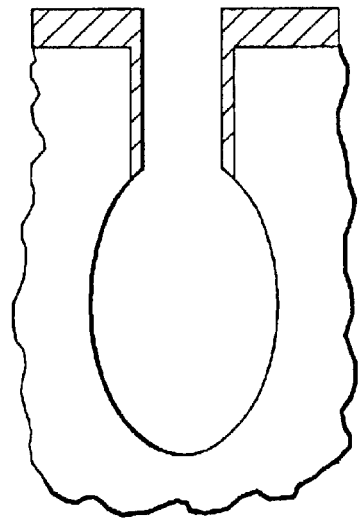
Figure 4F:
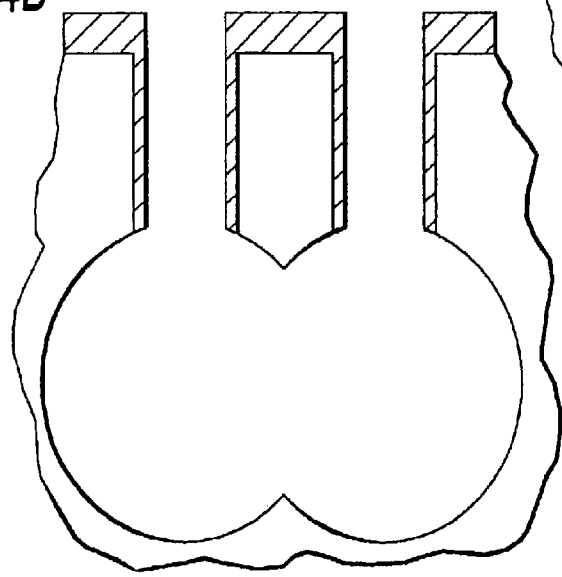

The double spherical profile shown in FIG. 4F can be obtained by continued isotropic etching of closely adjacent shaped cavities, in order to remove the substrate between the shaped cavities. The double spherical profile shown in FIG. 4F is useful as a cantilever for an accelerometer, for example.

Any combination of shaped opening and shaped cavity profiles (including but not limited to those illustrated in FIGS. 3 and 4) can be achieved by manipulating the various process conditions (such as etchant gas composition and flow rates, source power, bias power, helium cooling backside pressure) during etching of the shaped opening and shaped cavity(ies).

FIGS. 5A–5F illustrate a preferred embodiment of the method of the invention which is useful in semiconductor damascene processes and for etching trenches with embedded vessels, for example. Liquids can be guided along the trenches into the vessels. This embodiment of the invention makes use of a patterned etch barrier layer to guide the etching process.

Figure 5A:
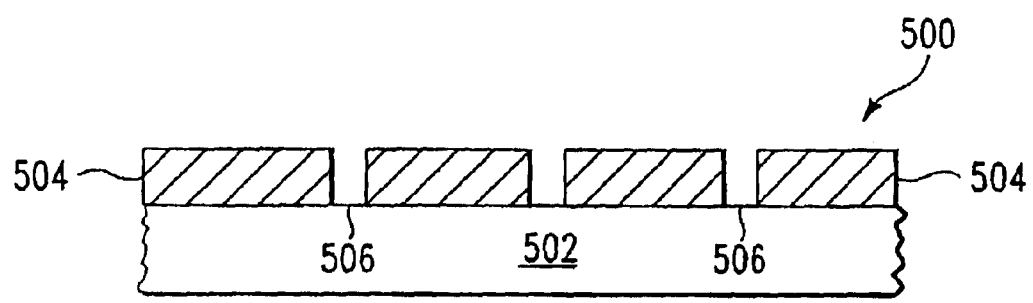
FIGS. 5A–5F illustrate a preferred embodiment of the method of the invention, which makes use of a patterned etch barrier layer to guide the etching process.

Referring to FIG. 5A, a structure is provided comprising a patterned etch barrier layer 504 on an upper surface of a substrate 502. Typical substrate materials are listed above, with reference to the general method of the invention. Techniques known in the art are used to pattern etch the barrier layer 504, exposing a portion 506 of an upper surface of the underlying substrate. The relative thicknesses of the film layers illustrated in the figures are not to scale. The drawings are intended only to show the order in which the various layers are deposited on the substrate.

Figure 5B:
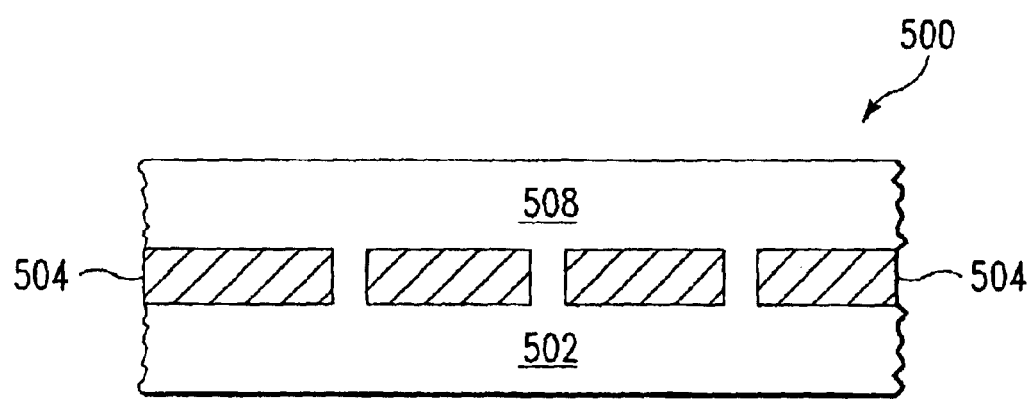

Referring to FIG. 5B, a layer 508 of a fill material is then deposited on top of the etch barrier layer 504 using deposition techniques known in the art. In the structure shown in FIG. 5B, the fill material comprises the same material as the substrate, so no interface is shown between the layer 508 of fill material and the substrate 502. The substrate materials listed above can also be used for the fill material layer.

Figure 5C:
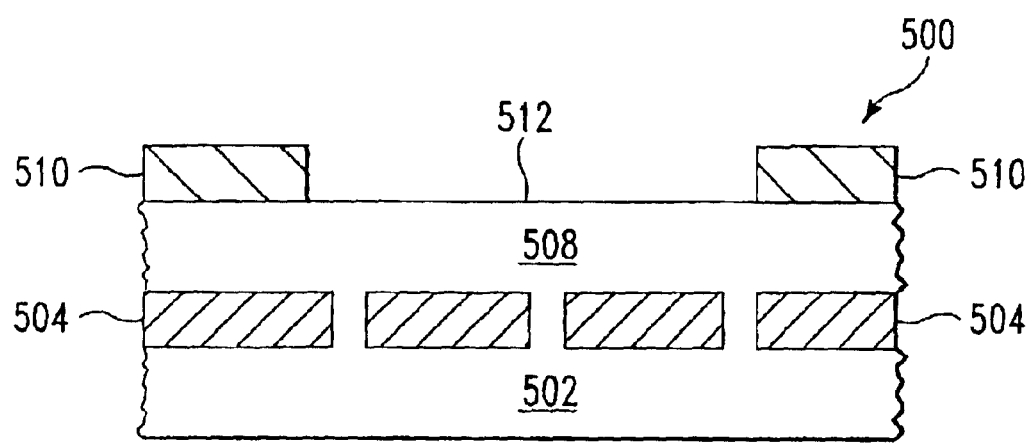

Referring to FIG. 5C, a patterned masking layer 510 is then provided on top of the fill material layer 508. The masking layer 510 is deposited and patterned using techniques known in the art, to expose a portion 512 of a surface of the fill material 508.

Figure 5D:
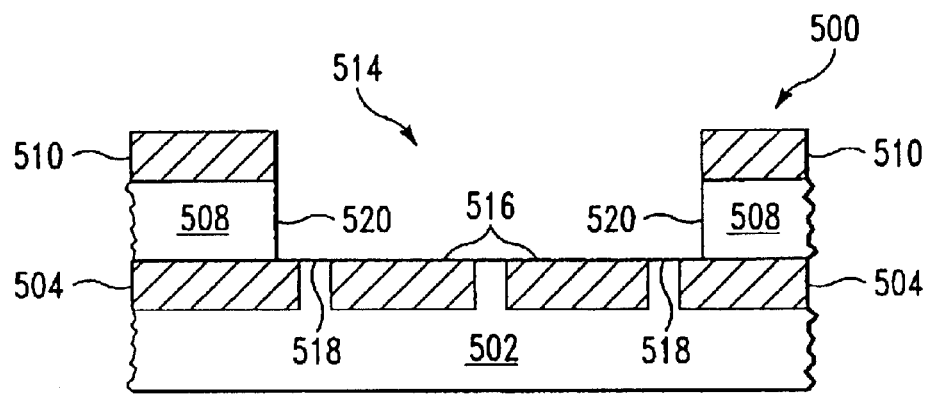

Referring to FIG. 5D, a shaped opening 514 is then etched in the fill material layer 508 to a first predetermined depth using etching techniques known in the art, depending on the fill material. Etching is performed using an etchant gas which selectively etches the fill material 508 relative to the masking layer 510 and the etch barrier layer 504. A sidewall 520 of the fill material 508, an upper surface 516 of the etch barrier layer 504, and a portion 518 of a surface of the underlying substrate 502 are exposed during this etching step.

Figure 5E:
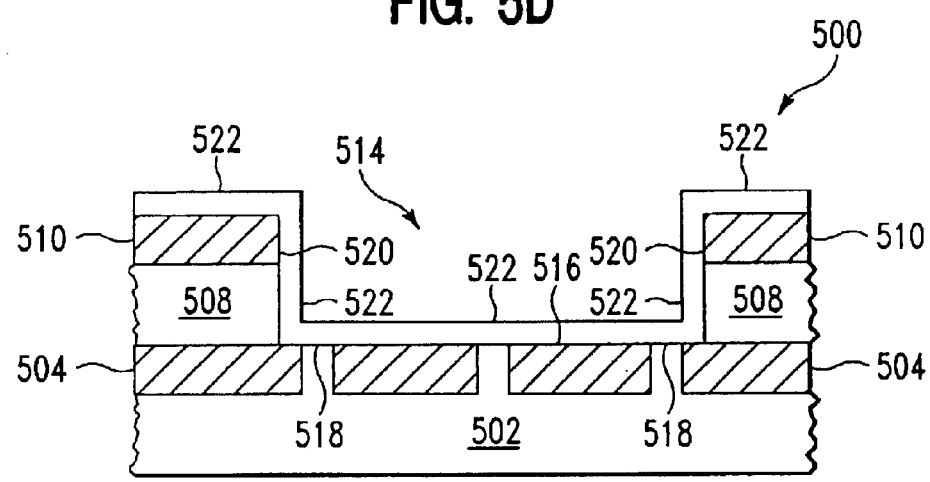

Referring to FIG. 5E, a conformal protective layer 522 is then formed overlying at least the sidewall 520 of the fill material 508. Typically, the protective layer 522 is also formed on a surface 516 of the etch barrier layer 504 and a portion 518 of a surface of the underlying substrate 502. The protective layer 522 comprises a material having a different etch selectivity than the substrate 502 and the fill material 508. Typical protective layer materials, and preferred substrate (fill material)/protective layer combinations are listed above, with reference to the general method of the invention.

The protective layer 522 is typically formed to have a thickness of at least several atomic layers on interior surfaces of the shaped opening 514. The thickness of the protective layer is typically within the range of about 10 Å to about 500 Å. The thickness of the protective layer depends on a number of factors, including, but not limited to, the composition of the protective layer, the composition of the substrate, and the feature size and aspect ratio of the shaped opening. The required protective layer thickness for a particular application can be determined through routine experimentation.

Figure 5F:
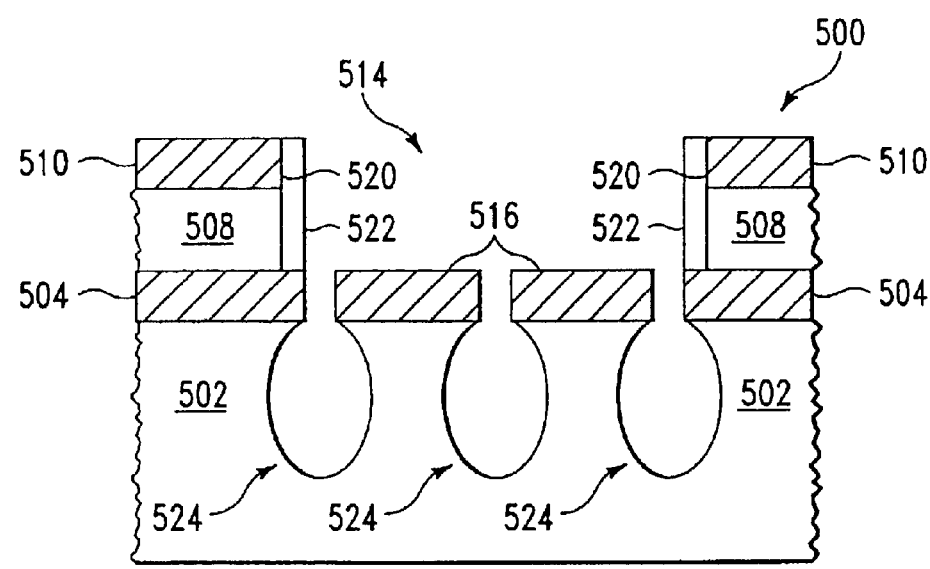

Referring to FIG. 5F, the protective layer 522 is then anistropically etched to remove portions of the protective layer which overlie the upper surface of the etch barrier layer 504 and the upper surface of the underlying substrate 502, if necessary. Anisotropic etching is performed using any suitable apparatus and techniques known in the art. At least a portion of underlying substrate 502 at the bottom of the opening 514 is exposed during this step.

A shaped cavity 524 is then etched in the underlying substrate 502 to a second predetermined depth. The shaped cavity 524 directly underlies and is in continuous communication with the shaped opening 514. The shaped cavity 524 is etched using an etchant gas which selectively etches the substrate relative to the protective layer (i.e., the etchant gas etches the substrate at a much faster rate than the protective layer), such that the protective layer effectively preserves the profile of the shaped opening during etching of the shaped cavity, allowing the shaped cavity to be etched to have a different shape than the shaped opening, if so desired.

FIGS. 6A–6D illustrate another preferred embodiment of the method of the invention which is useful in the manufacture of vertical transistors, for example. This embodiment of the invention makes use of implanted etch stops to guide the etching process.

Figure 6A:
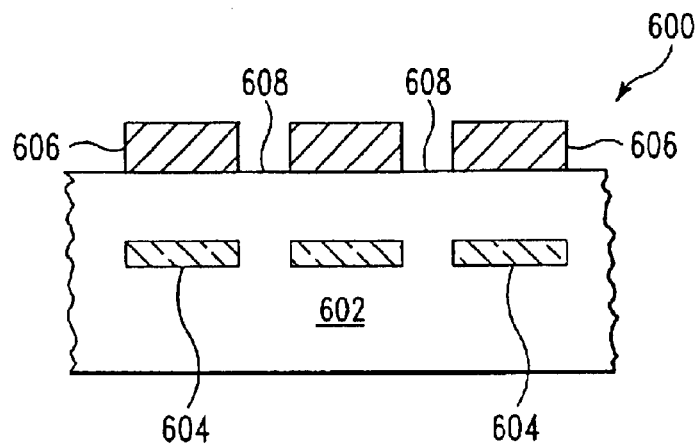
FIGS. 6A–6D illustrate another preferred embodiment of the method of the invention, which makes use of implanted etch stops to guide the etching process.

Referring to FIG. 6A, a structure is provided comprising a patterned masking layer 606 on an upper surface of a single-crystal silicon substrate 602. A portion 608 of a surface of the underlying substrate 602 is exposed through the patterned masking layer 606. A material 604 selected from the group consisting of an oxygen-comprising compound and a nitrogen-comprising compound has been implanted to, or created at, a first predetermined depth within the substrate 602 using implantation techniques known in the art.

Figure 6B:
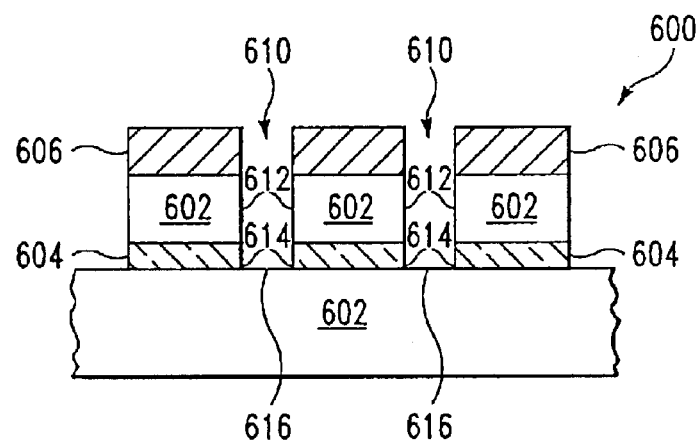

Referring to FIG. 6B, a shaped opening 610 is then etched in the fill material layer 602 to a second predetermined depth using etching techniques known in the art, depending on the substrate. Etching is performed using an etchant gas which selectively etches the substrate 602 relative to the masking layer 606 and the implanted material 604. The second predetermined depth is calculated so that the bottom 616 of the opening 610 is even with the bottom of the implanted material 604. A sidewall 612 of the substrate 602, a sidewall 614 of the implanted material 608, and an upper surface 616 of the underlying substrate 602 are exposed during this etching step.

Figure 6C:
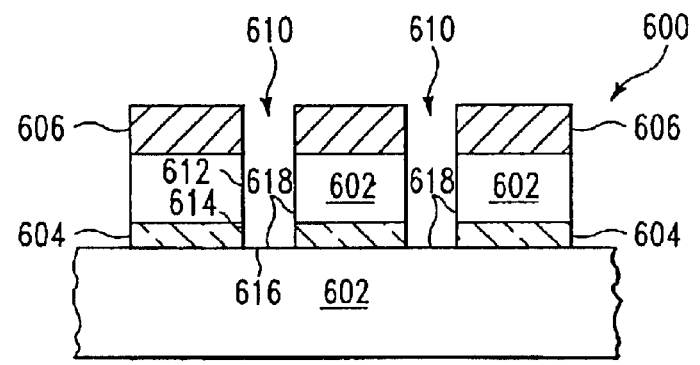

Referring to FIG. 6C, a conformal protective layer 618 is then formed overlying at least the exposed substrate sidewall 612 and the exposed implanted material sidewall 614. Typically, the protective layer is also formed on an exposed substrate surface at the bottom 616 of the shaped opening 610. The protective layer 618 comprises a material having a different etch selectivity than the substrate 602. Typical protective layer materials, and preferred substrate/protective layer combinations are listed above, with reference to the general method of the invention.

The protective layer 618 is typically formed to have a thickness of at least several atomic layers on interior surfaces of the shaped opening 610. The thickness of the protective layer is typically within the range of about 10 Å to about 500 Å. The thickness of the protective layer depends on a number of factors, including, but not limited to, the composition of the protective layer, the composition of the substrate, and the feature size and aspect ratio of the shaped opening. The required protective layer thickness for a particular application can be determined through routine experimentation.

Figure 6D:
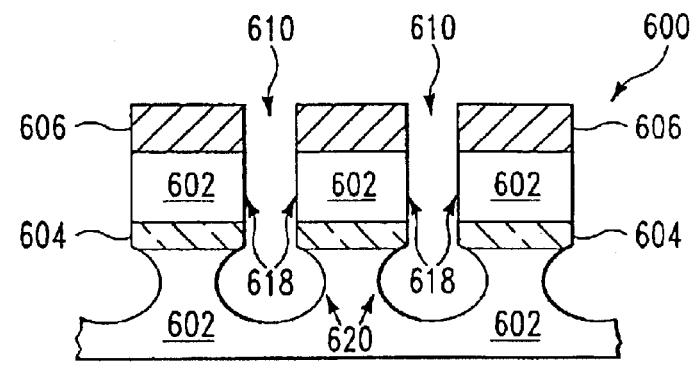

Referring to FIG. 6D, the protective layer 618 is then anistropically etched to remove portions of the protective layer overlying the bottom 616 of the opening 610, if necessary. Anisotropic etching is performed using any suitable apparatus and techniques known in the art. At least a portion of underlying substrate 602 at the bottom 616 of the opening 610 is exposed during this step.

A shaped cavity 620 is then etched in the underlying substrate 602 to a third predetermined depth. The shaped cavity directly underlies and is in continuous communication with the shaped opening. The shaped cavity is etched using an etchant gas which selectively etches the substrate relative to the protective layer (i.e., the etchant gas etches the substrate at a much faster rate than the protective layer), such that the protective layer effectively preserves the profile of the shaped opening during etching of the shaped cavity, allowing the shaped cavity to be etched to have a different shape than the shaped opening, if so desired.

FIGS. 7A–7E illustrate another preferred embodiment of the method of the invention which results in the formation of a double spherical profile useful as a cantilever for an accelerometer, for example. This embodiment of the invention makes use of a lateral (unpatterned) etch barrier layer to guide the etching process.

Figure 7A:
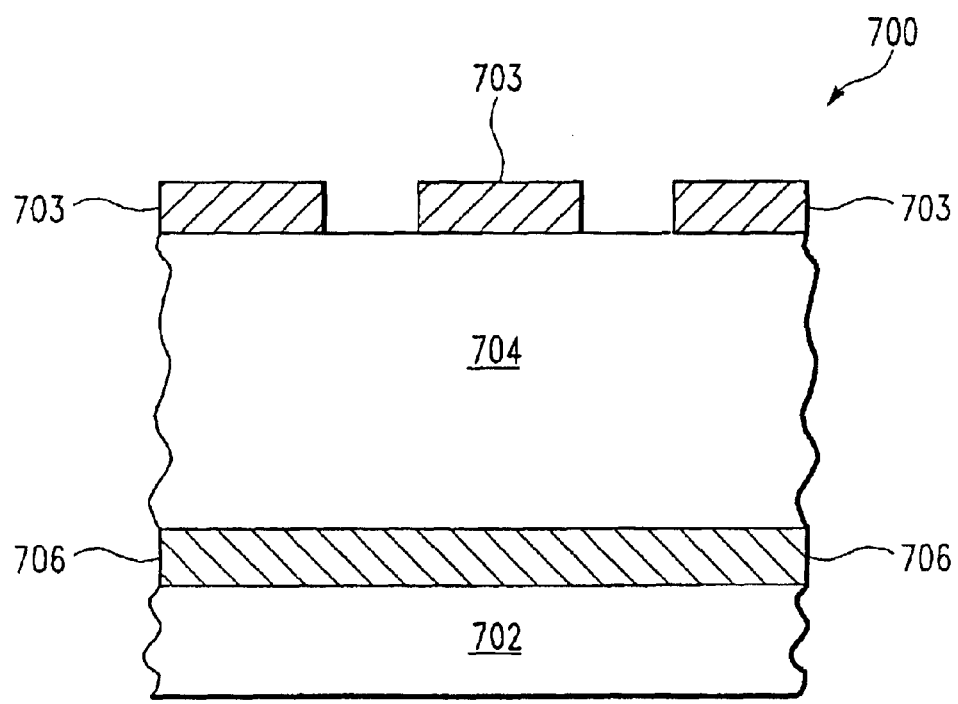
FIGS. 7A–7E illustrate another preferred embodiment of the method of the invention, which makes use of a lateral (unpatterned) etch barrier layer to guide the etching process.

Referring to FIG. 7A, a film stack 700 is provided overlying a substrate 702. Typical substrate materials are listed above, with reference to the first general method of the invention. The film stack includes, from top to bottom, a layer 704 of a fill material and an etch barrier layer 706, all deposited on an upper surface of the substrate 702 using deposition techniques known in the art. The substrate materials listed above can also be used for the fill material layer. Typically, the film stack also includes an overlying patterned masking layer 703 to guide the etching process.

Figure 7B:
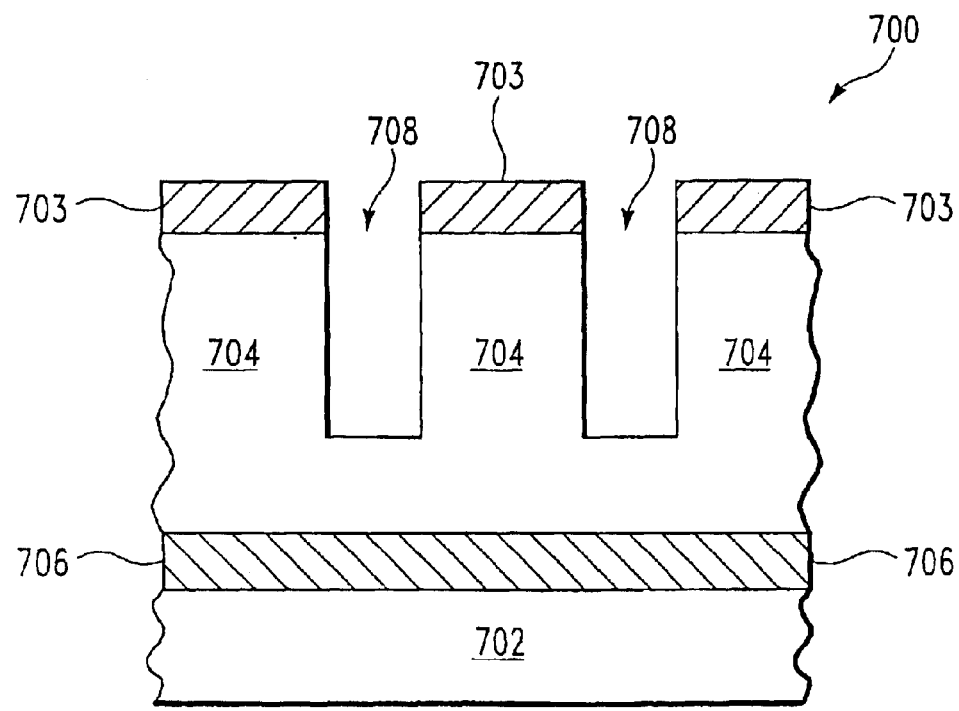

Referring to FIG. 7B, the fill material layer 704 is then etched to a first predetermined depth to form a shaped opening 708 using etching techniques known in the art.

Figure 7C:
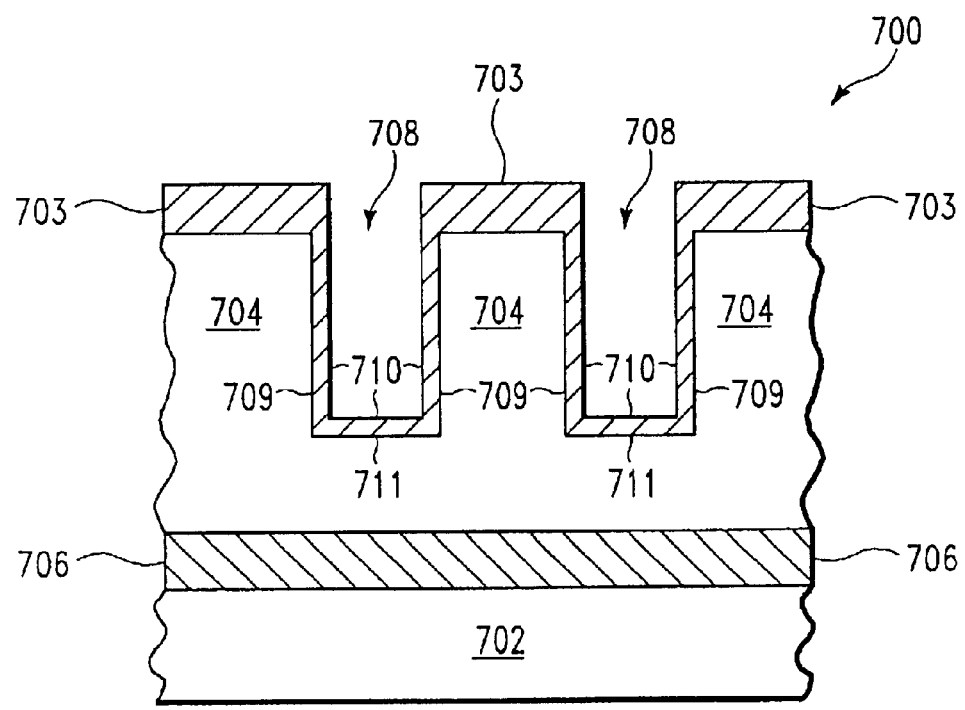

Referring to FIG. 7C, a conformal protective layer 710 is then formed on at least the sidewall 709 of the shaped opening 708. Typically, the protective layer 710 is also formed on the bottom 711 of the shaped opening. The protective layer 710 comprises a material having a different etch selectivity than the fill material 704. Typical protective layer materials, and preferred substrate (fill material)/protective layer combinations are listed above, with reference to the general method of the invention.

The protective layer 710 is typically formed to have a thickness of at least several atomic layers on interior surfaces of the shaped opening 708. The thickness of the protective layer is typically within the range of about 10 Å to about 500 Å. The thickness of the protective layer depends on a number of factors, including, but not limited to, the composition of the protective layer, the composition of the substrate, and the feature size and aspect ratio of the shaped opening. The required protective layer thickness for a particular application can be determined through routine experimentation.

Figure 7D:
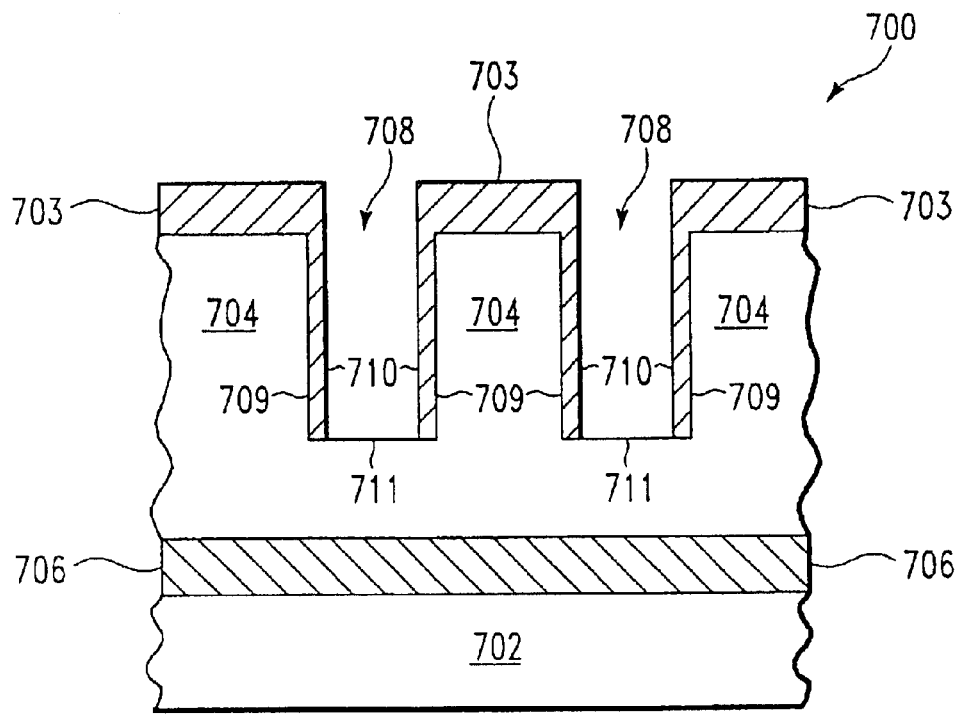

Referring to FIG. 7D, the protective layer 710 is then anistropically etched to remove portions of the protective layer which overlie the bottom 711 of the shaped opening 708, if necessary. Anisotropic etching is performed using any suitable apparatus and techniques known in the art. At least a portion of the underlying fill material 704 at the bottom of the shaped opening 708 is exposed during this step.

Figure 7E:
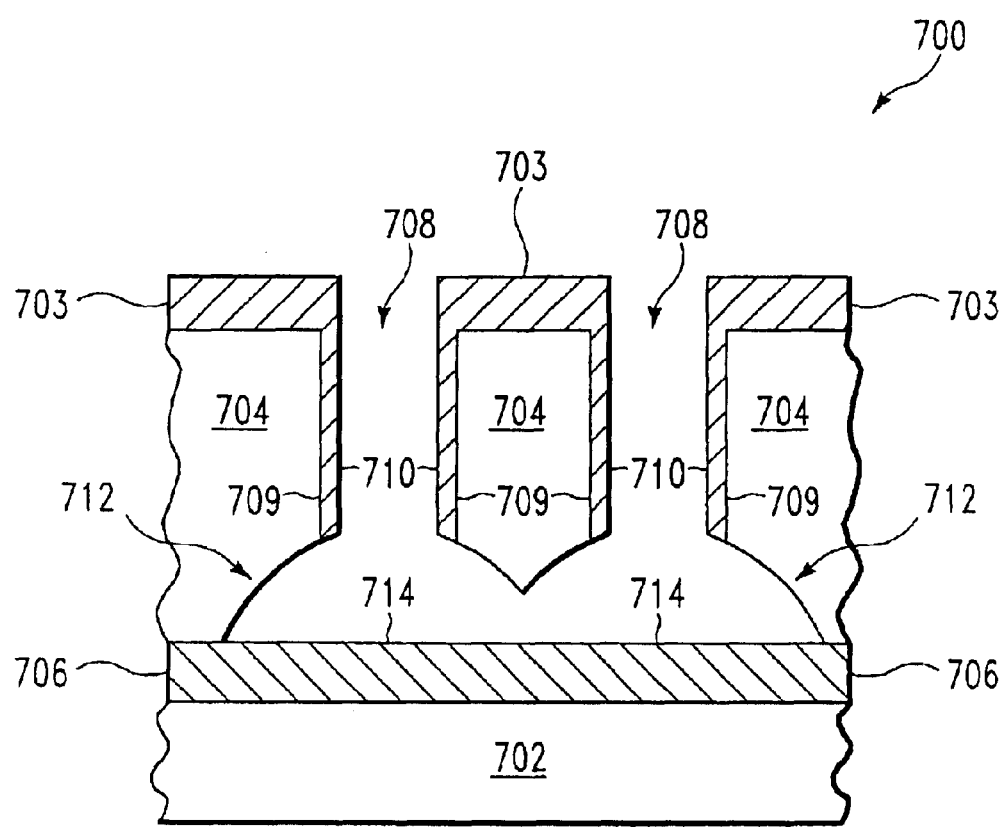

Referring to FIG. 7E, a shaped cavity 712 is then etched in the exposed fill material 704 to a second predetermined depth, whereby an upper surface 714 of the etch barrier layer 706 is exposed. The shaped cavity directly underlies and is in continuous communication with the shaped opening. The shaped cavity is etched using an etchant gas which selectively etches the fill material relative to the protective layer and the etch barrier layer (i.e., the etchant gas etches the fill material at a much faster rate than the protective layer and the etch barrier layer), such that the protective layer effectively preserves the profile of the shaped opening during etching of the shaped cavity, allowing the shaped cavity to be etched to have a different shape than the shaped opening, if so desired.

The double spherical profile shown in FIG. 7E is obtained by continued isotropic etching of closely adjacent shaped cavities, in order to remove the fill material between the shaped cavities. The lateral etch barrier layer 706 serves to prevent further downward etching of the shaped cavity 712 into the underlying substrate 702.

FIGS. 7F–7J illustrate an alternative embodiment of the above method, which also results in the formation of a double spherical profile useful as a cantilever for an accelerometer, for example. This embodiment of the invention makes use of multiple lateral etch barrier layers to guide the etching process.

Figure 7F:
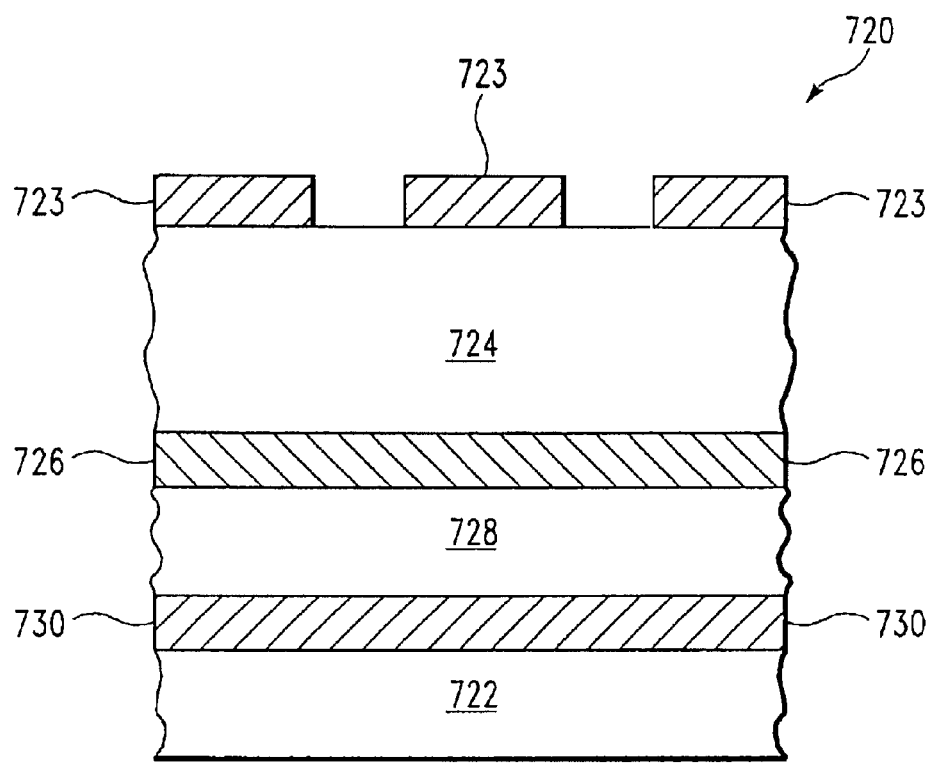
FIGS. 7F–7J illustrate an alternative embodiment of the method shown in FIGS. 7A–7E, which makes use of multiple lateral etch barrier layers to guide the etching process.

Referring to FIG. 7F, a film stack 720 is provided overlying a substrate 722. Typical substrate materials are listed above, with reference to the first general method of the invention. The film stack includes, from top to bottom, a first layer 724 of a fill material, a first etch barrier layer 726, a second layer 728 of a fill material, and a second etch barrier layer 730, all deposited on an upper surface of the substrate 722 using deposition techniques known in the art. The substrate materials listed above can also be used for the fill material layers. Typically, the film stack also includes an overlying patterned masking layer 723 to guide the etching process.

Figure 7G:
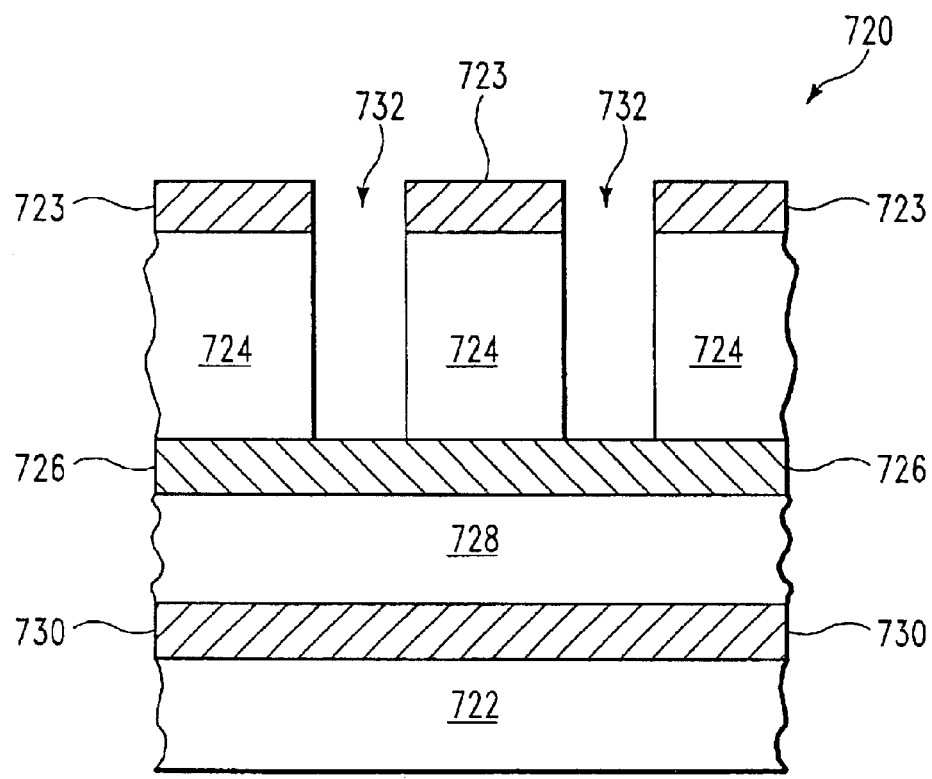

Referring to FIG. 7G, the first fill material layer 724 is then etched to a first predetermined depth to form a shaped opening 732, whereby an upper surface of the first etch barrier layer 726 is exposed. Etching is performed using an etchant gas which selectively etches the first fill material relative to the first etch barrier layer (i.e., the etchant gas etches the first fill material at a much faster rate than the first etch barrier layer).

Figure 7H:
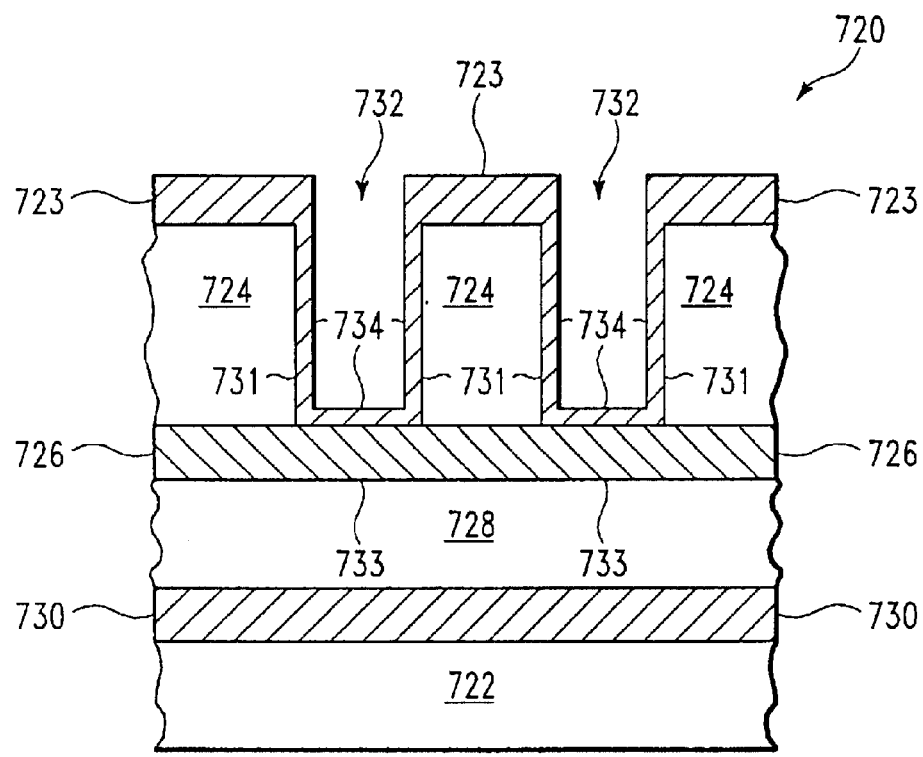

Referring to FIG. 7H, a conformal protective layer 734 is then formed on at least the sidewall 731 of the shaped opening 732. Typically, the protective layer 734 is also formed overlying the portion of the first etch barrier layer 726 at the bottom 733 of the shaped opening 732. The protective layer 734 comprises a material having a different etch selectivity than the first fill material 724. Typical protective layer materials, and preferred substrate (fill material)/protective layer combinations are listed above, with reference to the general method of the invention.

The protective layer 734 is typically formed to have a thickness of at least several atomic layers on interior surfaces of the shaped opening 732. The thickness of the protective layer is typically within the range of about 10 Å to about 500 Å. The thickness of the protective layer depends on a number of factors, including, but not limited to, the composition of the protective layer, the composition of the substrate, and the feature size and aspect ratio of the shaped opening. The required protective layer thickness for a particular application can be determined through routine experimentation.

Figure 7I:
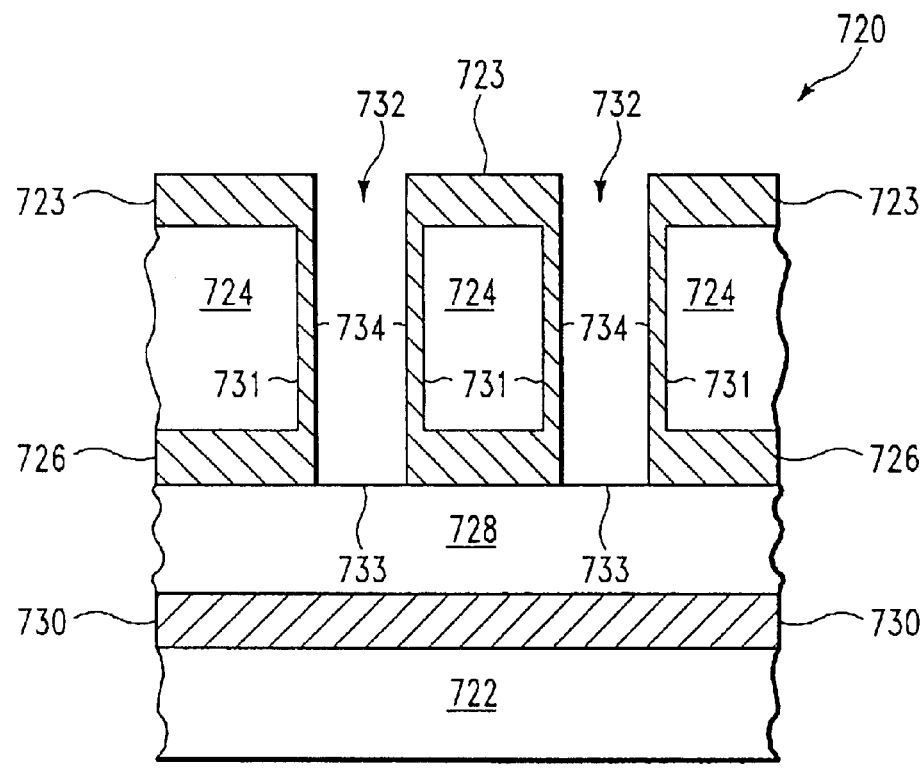

Referring to FIG. 7I, the first etch barrier layer 726 is then anistropically etched to remove the portion of the first etch barrier layer 726 at the bottom 733 of the shaped opening 732. Portions of the protective layer 734 which overlie the first etch barrier layer 726 are also removed during this process, if necessary. Anisotropic etching is performed using any suitable apparatus and techniques known in the art. At least a portion of the second fill material 728 is exposed during this step.

Figure 7J:
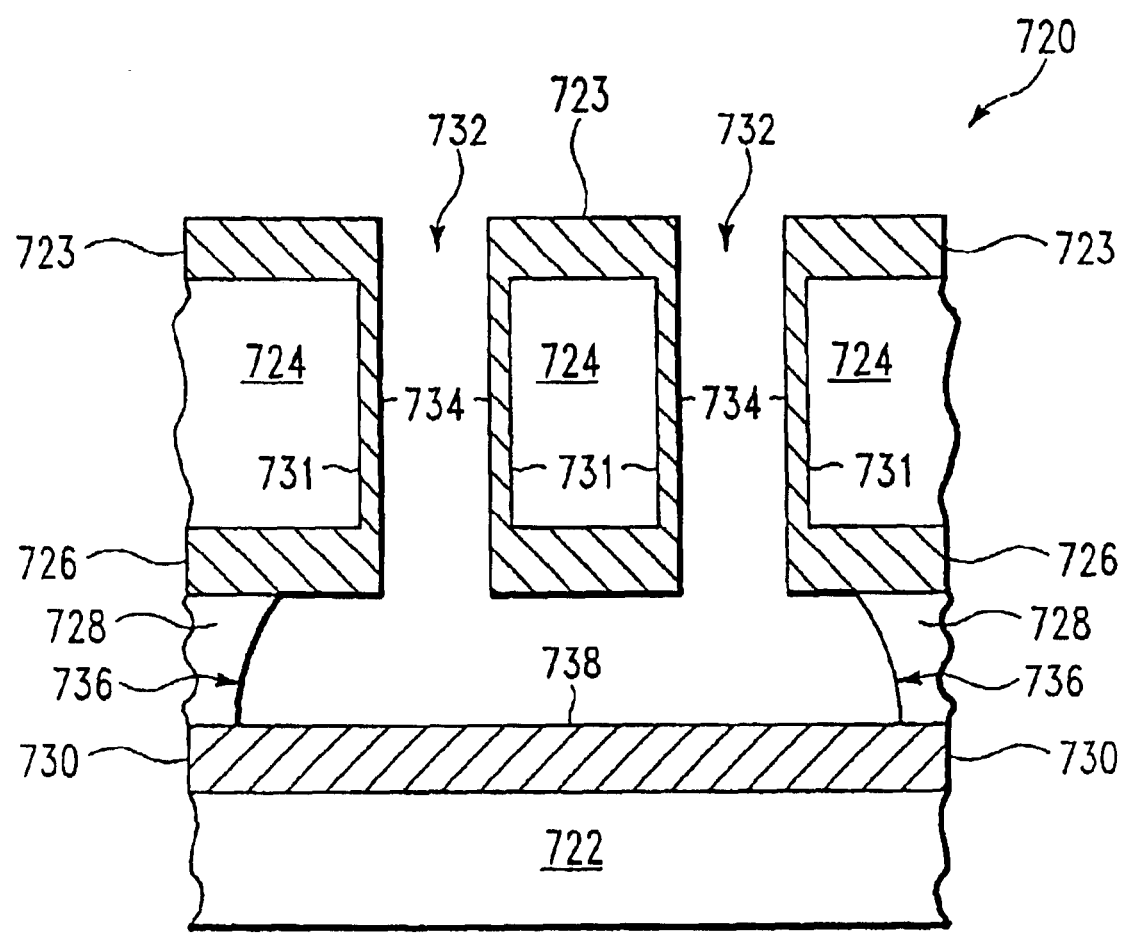

Referring to FIG. 7J, a shaped cavity 736 is then etched in the exposed second fill material 728 to a second predetermined depth, whereby an upper surface 738 of the second etch barrier layer 730 is exposed. The shaped cavity directly underlies and is in continuous communication with the shaped opening. The shaped cavity is etched using an etchant gas which selectively etches the second fill material relative to the protective layer and the second etch barrier layer (i.e., the etchant gas etches the second fill material at a much faster rate than the protective layer and the second etch barrier layer), such that the protective layer effectively preserves the profile of the shaped opening during etching of the shaped cavity, allowing the shaped cavity to be etched to have a different shape than the shaped opening, if so desired.

The double spherical profile shown in FIG. 7J is obtained by continued isotropic etching of closely adjacent shaped cavities, in order to remove the fill material between the shaped cavities. The second etch barrier layer 730 serves to prevent further downward etching of the shaped cavity 736 into the underlying substrate 722.

The methods of the invention are particularly useful in the manufacture of semiconductor devices having small feature sizes, as described in Section IV, below.

IV. The Method of Forming a Multi-Part Cavity FOR USE IN A SEMICONDUCTOR DEVICE

Examples One and Two, below, provide specific process parameters for forming a multi-part cavity for use in the manufacture of a semiconductor structure.

EXAMPLE ONE

Figure 8A:
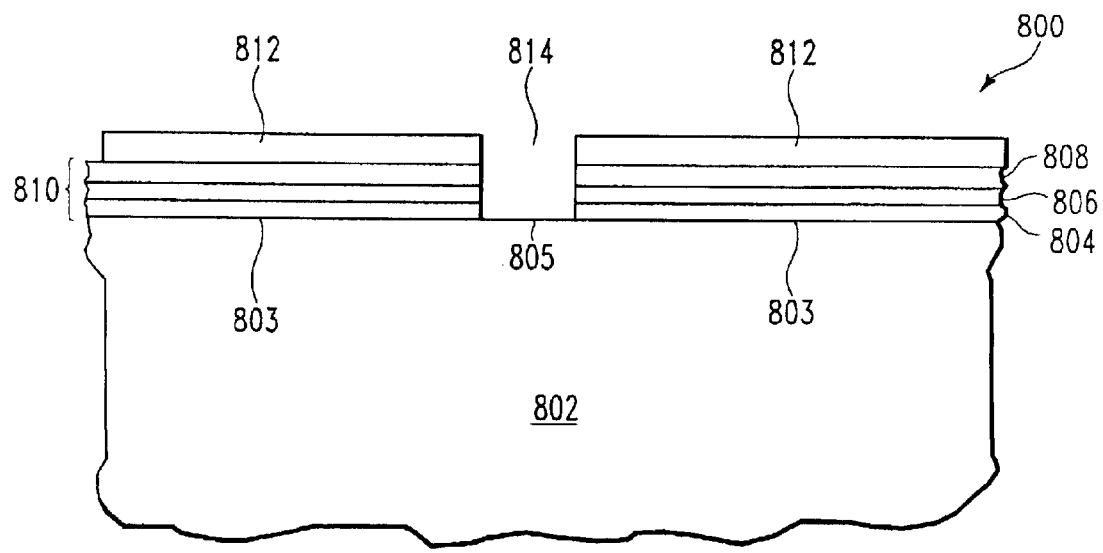
FIGS. 8A–8N illustrate a particularly preferred method of the invention for forming a semiconductor device.
Figure 8B:
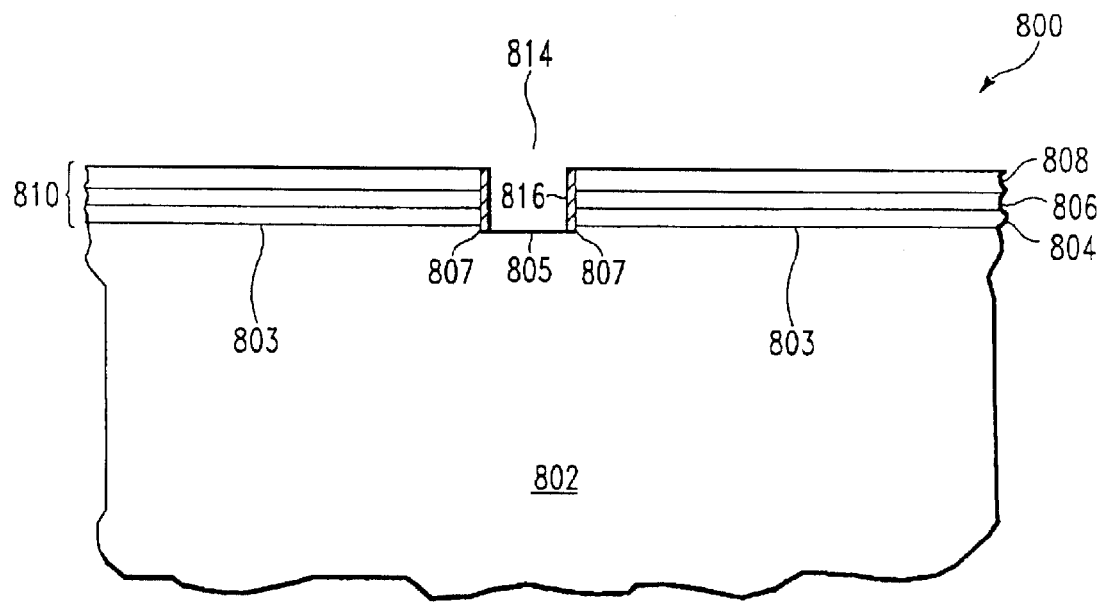
FIG. 8B shows the structure of FIG. 8A after oxidation of an exposed sidewall of the film stack 810 and an exposed upper surface of the silicon substrate 802 to provide a thin oxidized coating 816 which functions to protect the sidewall of the silicon nitride etch barrier layer 806 and the exposed upper corner 807 of the silicon substrate 802 during subsequent etching steps.

Referring to FIG. 8A, a patterned film stack 810 was provided on an upper surface of a single-crystal silicon substrate 802. The patterned film stack included, from top to bottom, a silicon oxide masking layer 808, a silicon nitride etch barrier layer 806, and a gate dielectric layer 804. An upper surface 805 of the single-crystal silicon substrate 802 was exposed through the masking layer 808, the etch barrier layer 806, and the gate dielectric layer 804.

In this instance, the gate dielectric layer 804 was a silicon oxide ($SiO_x$) layer formed by thermal oxidation of the underlying single-crystal silicon substrate 802, using techniques known in the art. The thickness of the gate dielectric layer 804 on the substrate surface 803 was approximately 50 Å.

The silicon nitride layer 806, which functions as an etch barrier layer throughout the method of the invention, was formed to have an initial thickness of approximately 2500 Å. Other possible materials that can serve as etch barrier layers include, by way of example and not by way of limitation, silicon dioxide, titanium nitride, and metal oxides such as titanium oxide and iridium oxide. The silicon nitride etch barrier layer 806 was deposited using rapid thermal processing (RTP) chemical vapor deposition (CVD) techniques known in the art. The silicon nitride etch barrier layer 806 can alternatively be deposited from TEOS using LPCVD techniques known in the art.

The silicon oxide masking layer 808 was formed to have a thickness of approximately 50–70 Å. The silicon oxide masking layer 808 was deposited from TEOS using LPCVD techniques. Alternatively, the masking layer may be BPSG (boron phosphate silicate glass) or BSG (boron silicate glass).

The film stack 810 was patterned using a photoresist 812. The photoresist 812 can be any suitable photoresist material known in the art. Patterning of the photoresist 812 will depend on the particular photoresist material used and should be performed according to the photoresist manufacturer's instructions.

Pattern etching of the film stack 810 was performed using a reactive ion etching (RIE) mask opening process in an Applied Materials' MXP chamber. Gas flow was 50 sccm $CF_4$, 15 sccm $CHF_3$, and 120 sccm Ar. The process chamber pressure was 100 mTorr. An RF source power of 500 W was provided at a frequency of 2 MHZ. A magnetic field of 30 gauss was provided.

The photoresist 812 was then removed by resist ashing in a commercially available downstream etcher, using oxygen and fluorine species at elevated wafer temperature.

During development of the method described in U.S. application Ser. No. 09/144,088, we discovered that, due to extended exposure to a high density plasma during etching, the silicon nitride etch barrier layer and the upper corner of the single-crystal silicon substrate directly underlying the silicon nitride etch barrier layer tended to become undercut. Undercutting of the silicon nitride etch barrier layer and the upper corner of the single-crystal silicon substrate can result in alteration of the etch profile of the shaped opening, which in turn can affect the electrical properties of the resulting device. This problem was not evident in prior art methods which utilized lower density plasma etching. When a lower density plasma is used, there tends to be a significant amount of back-sputtering during etching, resulting in the deposition of a protective oxide coating on the field surface and upper sidewall of the shaped opening. With high density plasma etching, there is an insignificant amount of back-sputtering; therefore, the silicon nitride etch barrier layer and the upper sidewall of the single-crystal silicon substrate remain exposed to attack by gaseous species during etching. Therefore, we needed a method which provides protection for the silicon nitride etch barrier layer and the upper corner of the single-crystal silicon substrate during etching.

Following the pattern etching step and photoresist removal, the exposed sidewall of the film stack 810 and a portion of the exposed surface of the silicon substrate 802, including the upper silicon sidewall 807, were oxidized by exposure to $O_2$ in order to provide a thin oxidized coating 816 which functions to protect the silicon nitride etch barrier layer 806 and the exposed upper sidewall 807 of the silicon substrate 802 during subsequent etching steps.

The oxidized coating 816 was then anisotropically etched in a breakthrough step to remove the portion of the oxidized coating overlying the upper surface of the silicon substrate (not shown). The goal of this silicon oxide breakthrough step is to expose the upper surface 805 of the silicon substrate 802 to allow for etching of the shaped opening 818 (shown in FIG. 8C) into the substrate 802. The oxidized coating 816 was anisotropically etched by $CF_4$ sputtering in an Applied Materials' DPS™ silicon etch chamber. In this case, the oxidized coating 816 was etched using 85 sccm $CF_4$, with a plasma source power of 600 W, for approximately 10 seconds.

Figure 8C:
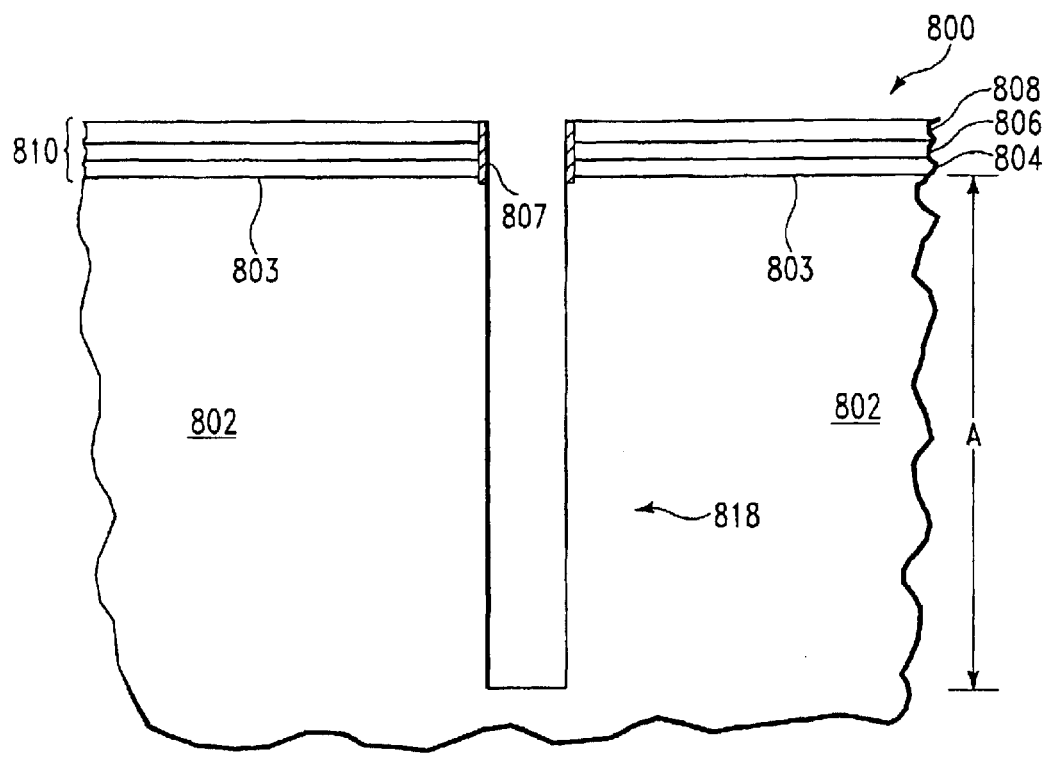
FIG. 8C shows the structure of FIG. 8B after a shaped opening 818 has been etched to a predetermined depth A in the underlying silicon substrate 802.

As shown in FIG. 8C, a shaped opening 818 was then etched to a predetermined depth A in the single-crystal silicon substrate 802 using an Applied Materials' CENTURA® DPS™ deep trench etch chamber. The shaped opening 818 is etched only to the depth to which the protective layer 820 (shown in FIG. 8D) will be deposited. In other words, the depth A of the shaped opening 818 is equal to the desired length of the protective layer 820. The length of the protective layer is determined by the electrical and profile requirements of the particular semiconductor device being manufactured, which are specified based on the particular end use application of the device. In this case, the depth A of the shaped opening 818 was approximately 1.5 μm. Process conditions for this etch step were as follows: 40 sccm $SF_6$, 40 sccm HBr, 40 sccm $O_2$; 20 mTorr process chamber pressure; 500 W source power; 20 W bias power; and 10° C. substrate temperature.

Figure 8D:
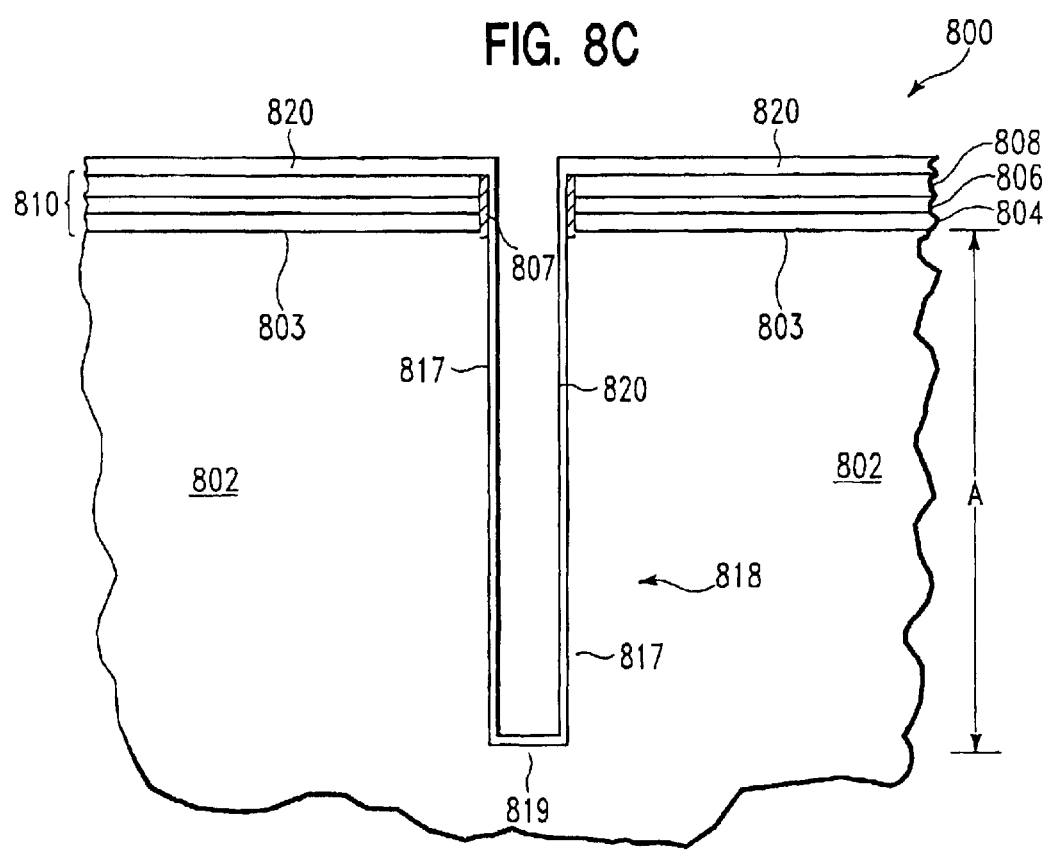
FIG. 8D shows the structure of FIG. 8C after formation of a conformal protective layer 820 over the remaining silicon oxide masking layer 808, the sidewalls of the silicon nitride etch barrier layer 806 and the gate dielectric layer 804, and the sidewall 817 and bottom 819 of the shaped opening 818.

Referring to FIG. 8D, a protective layer 820 comprising a conformal layer of silicon oxide was then formed over the silicon oxide masking layer 808 and the sidewall 817 and bottom 819 of the shaped opening 818. In this instance, the purpose of the protective layer 820 is two-fold: 1) to preserve the profile of the shaped opening during etching of the shaped cavity 822 (shown in FIG. 8F), and 2) to serve as an insulating layer (i.e., dielectric collar) in the final device structure. As described above, the length of the protective layer 820 is equal to the depth A of shaped opening 818.

The protective layer 820 was formed using LPCVD TEOS with 8–12% $O_3$. In this instance, the thickness of the protective layer 820 was about 200–300 Å on all surfaces.

Figure 8E:
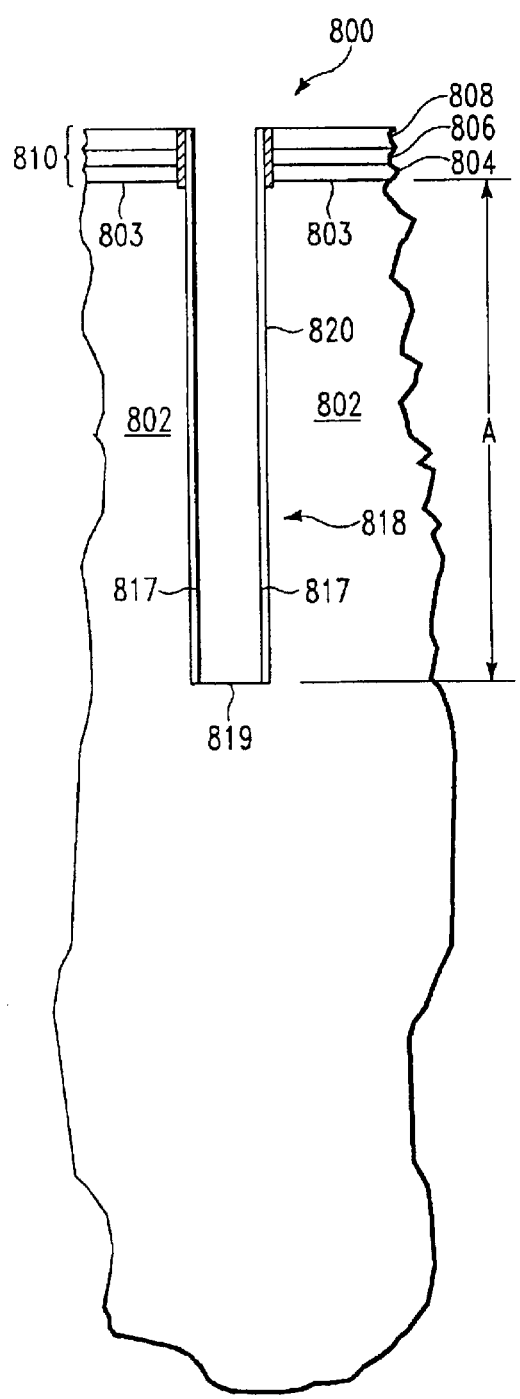
FIG. 8E shows the structure of FIG. 8D after anisotropic etching to remove the portions of the protective layer 820 which overlie the silicon oxide masking layer 808 and the bottom 819 of the shaped opening 818.

Referring to FIG. 8E, the protective layer 820 was then anisotropically etched to remove the portion of the protective layer overlying the silicon oxide masking layer 808 and the bottom 819 of the shaped opening 818. The goal of this etch step is to expose at least a portion of the single-crystal silicon substrate 802 at the bottom of the shaped opening 818, to allow for subsequent etching of the shaped cavity 822 (shown in FIG. 8F) into the substrate 802.

The protective layer 820 was anisotropically etched by $CF_4$ sputtering in an Applied Materials' sputter etch chamber. The etch process conditions used were as follows: 100 sccm $CF_4$; 100 mTorr process chamber pressure; 400 W source power; a 90 Watt bias power, and a 20° C. substrate temperature. Alternatively, the protective layer can be etched by Coronell's $C_4F_8$-based oxide etch in an Applied Materials' oxide MXP+ chamber. Typical process conditions are as follows: 45 sccm $C_4F_8$, 180 sccm Ar, 40 sccm CO; 100 to 150 mTorr process chamber pressure; 1100 W source power; and 20° C. substrate temperature.

Figure 8F:
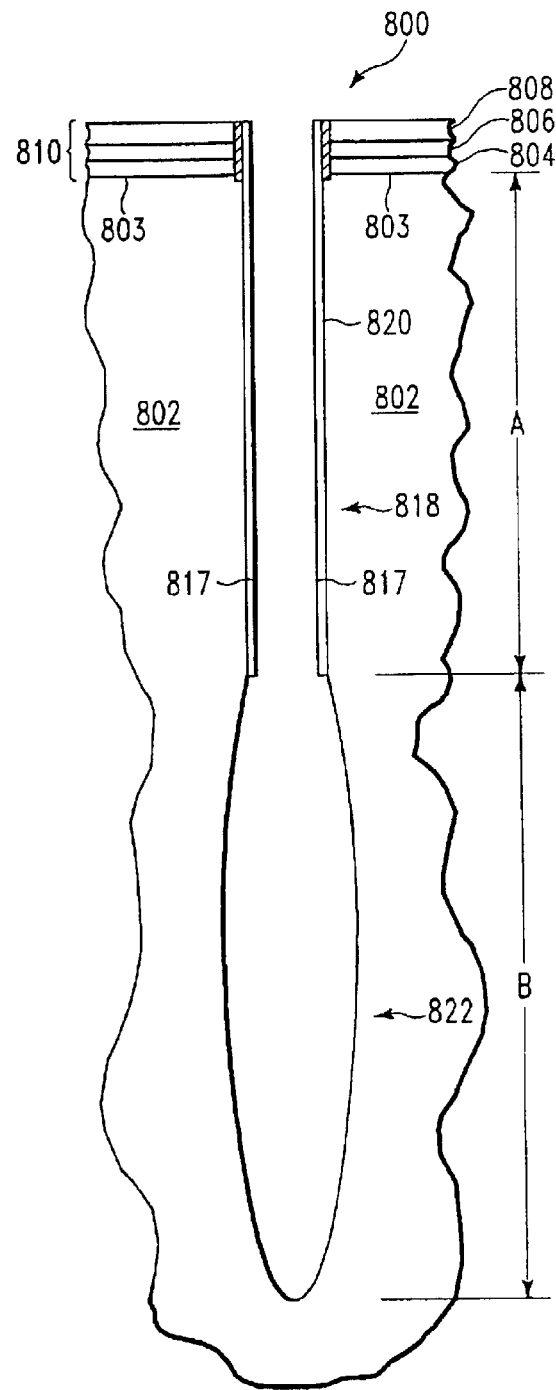
FIG. 8F shows the structure of FIG. 8E after a shaped cavity 822 has been etched to a predetermined depth B in the single-crystal silicon substrate 802.

As shown in FIG. 8F, a shaped cavity 822 was then etched to a predetermined depth B in the single-crystal silicon substrate 802 using an Applied Materials' CENTURA® DPS™ deep trench etch chamber. As illustrated in FIG. 8F, the shaped cavity 822 is formed directly beneath the shaped opening 818, and is in continuous communication with the shaped opening. The depth and shape of the shaped cavity 822 are determined by the electrical and profile requirements of the particular semiconductor device being manufactured. In this case, the depth B of the shaped cavity 822 was approximately 6.5 μm, and the cavity was formed in a vertical elliptical shape similar to that shown in FIG. 3E. The etch process conditions used were as follows: 40 sccm $SF_6$, 40 sccm HBr, 10 sccm $O_2$; 20 mTorr process chamber pressure; 500 W source power; 20 W bias power; and a 20° C.-50° C. substrate temperature. In order to form wider (e.g., horizontal elliptical) shaped cavities, the flow rate of $SF_6$ is increased, and the flow rates of HBr and $O_2$ are decreased. When etching very wide shaped cavities, HBr and $O_2$ can be omitted from the etchant gas.

A particularly preferred embodiment of the invention is a method of forming a trench capacitor in a single-crystal silicon substrate. Specific process parameters for forming the polysilicon-filled trench capacitor are set forth in Example Two, below.

EXAMPLE TWO

Referring back to FIG. 8A, a patterned film stack 810 was provided on an upper surface of a single-crystal silicon substrate 802. The patterned film stack included, from top to bottom, a silicon oxide masking layer 808, a silicon nitride etch barrier layer 806, and a gate dielectric layer 804. An upper surface 805 of the single-crystal silicon substrate 802 was exposed.

In this instance, the gate dielectric layer 804 was a silicon oxide ($SiO_x$) layer formed by thermal oxidation of the underlying single-crystal silicon substrate 802, using techniques known in the art. The thickness of the gate dielectric layer 804 on the substrate surface 803 was approximately 50 Å.

The silicon nitride layer 806, which functions as an etch barrier layer throughout the method of the invention, was formed to have an initial thickness of approximately 2200 Å. Other possible materials that can serve as etch barrier layers include, without limitation, silicon dioxide, titanium nitride, and metal oxides such as titanium oxide and iridium oxide.

The silicon nitride etch barrier layer 806 was deposited using rapid thermal processing (RTP) chemical vapor deposition (CVD) techniques known in the art. The silicon nitride etch barrier layer 806 can alternatively be deposited from TEOS using LPCVD techniques known in the art. The silicon oxide masking layer 808 was formed to have a thickness of approximately 50–70 Å. The silicon oxide masking layer 808 was deposited from TEOS using LPCVD techniques. Alternatively, the masking layer maybe BPSG (boron phosphate silicate glass) or BSG (boron silicate glass).

The film stack 810 was patterned using a photoresist 812. The photoresist 812 can be any suitable photoresist material known in the art. Patterning of the photoresist 812 will depend on the particular photoresist material used and should be performed according to the photoresist manufacturer's instructions.

Pattern etching of the film stack 810 was performed using a reactive ion etching (RIE) mask opening process in an Applied Materials' MXP chamber. Gas flow was 50 sccm $CF_4$, 15 seem $CHF_3$, and 120 sccm Ar. The process chamber pressure was 100 mTorr. An RF source power of 500 W was provided at a frequency of 13.56 MHZ. A magnetic field of 30 gauss was provided.

The photoresist 812 was then removed by resist ashing in a commercially available downstream etcher, using oxygen and fluorine radicals with elevated wafer temperature.

Following the pattern etching step and photoresist removal, the exposed sidewall of the film stack 810 and a portion of the exposed surface of the silicon substrate 802, including the upper silicon sidewall 807, were oxidized by exposure to $O_2$ in order to provide a thin oxidized coating 816 which functions to protect the silicon nitride etch barrier layer 806 and the exposed upper sidewall 807 of the silicon substrate 802 during subsequent etching steps.

The oxidized coating 816 was then anisotropically etched in a breakthrough step to remove the portion of the oxidized coating overlying the upper surface of the silicon substrate (not shown). The goal of this silicon oxide breakthrough step is to expose the upper surface 805 of the silicon substrate 802 to allow for etching of the shaped opening 818 (shown in FIG. 8C) into the substrate 802. The oxidized coating 816 was anisotropically etched by $CF_4$ sputtering in an Applied Materials' DPS™ silicon etch chamber. In this case, the oxidized coating 816 was etched using 85 sccm $CF_4$, with a source power of 600 W, for approximately 10 seconds.

As shown in FIG. 8C, a shaped opening 818 was then etched to a predetermined depth A in the single-crystal silicon substrate 802 using an Applied Materials' CENTURA® DPS™ deep trench etch chamber. The shaped opening 818 is etched only to the depth to which the protective layer 820 (shown in FIG. 8D) will be deposited. In other words, the depth A of the shaped opening 818 is equal to the desired length of the protective layer 820. The length of the protective layer is determined by the electrical and profile requirements of the particular semiconductor device being manufactured, which are specified based on the particular end use application of the device. In this case, the depth A of the shaped opening 818 was approximately 1.5 μm. Process conditions for this etch step were as follows: 40 sccm $SF_6$, 40 sccm HBr, 40 sccm $O_2$; 20 mTorr process chamber pressure; 500 W source power; 20 W bias power; and 10° C. substrate temperature.

Referring to FIG. 8D, a protective layer 820 comprising a conformal layer of silicon oxide was then formed over the silicon oxide masking layer 808 and the sidewall 817 and bottom 819 of the shaped opening 818. In this instance, the purpose of the protective layer 820 is two-fold: 1) to preserve the profile of the shaped opening during etching of the shaped cavity 822 (shown in FIG. 8F), and 2) to serve as an insulating layer (i.e., dielectric collar) in the final device structure. As described above, the length of the protective layer 820 is equal to the depth A of shaped opening 818.

The protective layer 820 was formed using LPCVD TEOS with 8–12% $O_3$. In this instance, the thickness of the protective layer 820 was about 200–300 Å on all surfaces.

Referring to FIG. 8E, the protective layer 820 was then anisotropically etched to remove the portion of the protective layer overlying the silicon oxide masking layer 808 and the bottom 819 of the shaped opening 818. The goal of this etch step is to expose at least a portion of the single-crystal silicon substrate 802 at the bottom of the shaped opening 818, to allow for subsequent etching of the shaped cavity 822 (shown in FIG. 8F) into the substrate 802.

The protective layer 820 was anisotropically etched by $CF_4$ sputtering in an Applied Materials' sputter etch chamber. The etch process conditions used were as follows: 100 sccm $CF_4$; 100 mTorr process chamber pressure; 400 W source power; a 90 W bias power, and a 20° C. substrate temperature. Alternatively, the protective layer can be etched by Coronell's $C_4F_8$-based oxide etch in an Applied Materials' oxide MXP⁺ chamber. Typical process conditions are as follows: 45 sccm $C_4F_8$, 180 sccm Ar, 40 sccm CO; 100–150 mTorr process chamber pressure; 1100 W source power; and 20° C. substrate temperature.

As shown in FIG. 8F, a shaped cavity 822 was then etched to a predetermined depth B in the single-crystal silicon substrate 802 using an Applied Materials' CENTURA® DPS™ deep trench etch chamber. As illustrated in FIG. 8F, the shaped cavity 822 is formed directly beneath the shaped opening 818, and is in continuous communication with the shaped opening. The depth and shape of the shaped cavity 822 are determined by the electrical and profile requirements of the particular semiconductor device being manufactured. In this case, the depth B of the shaped cavity 822 was approximately 6.5 μm, and the cavity was formed in a vertical elliptical shape similar to that shown in FIG. 3E. The maximum cross-sectional width of the cavity 822, in plane parallel to the upper surface of structure 800 is greater than the essentially constant cross-sectional width of shaped opening 818 in a plane parallel to the upper surface of the structure 800, as shown in FIG. 8F. The etch process conditions used were as follows: 40 sccm $SF_6$, 40 seem HBr, 10 sccm $O_2$; 20 mTorr process chamber pressure; 500 W source power; 20 W bias power; and a 20° C.–50° C. substrate temperature. Substrate temperature may be used to adjust the shape of the cavity, where a higher substrate temperature tends to produce a more rounded cavity, increasing the maximum cross-sectional width of the cavity 822 in a plane parallel to the upper surface of structure 800.

Referring to FIG. 8G, a conformal dielectric film 824 was then formed overlying the remaining silicon oxide masking layer 808, the protective layer 820, and the sidewall 821 and bottom 823 of the shaped cavity 822. In this instance, the conformal dielectric film 824 was a multi-layered dielectric film comprising a layer each of silicon oxide, silicon nitride, and silicon oxynitride (collectively known as "ONO"-oxide/nitride/oxynitride). The silicon oxide and silicon nitride layers were deposited using RTP CVD techniques. The silicon oxide and silicon nitride layers can alternatively be deposited from TEOS using CVD techniques. The silicon nitride layer was oxidized on top by exposure to $O_2$ to form silicon oxynitride.

The oxide/nitride/oxynitride layers were formed in approximately a 1:1:1 thickness ratio. In this case, the total thickness of the conformal dielectric film 1124 (i.e., the ONO layer) was approximately 60–80 Å on all surfaces.

Referring to FIG. 8H, a layer 826 of polysilicon was then deposited over the conformal dielectric film 824 to fill both the shaped cavity 822 and the shaped opening 818. The polysilicon 826 was deposited by furnace using techniques known in the art.

Figure 8I:
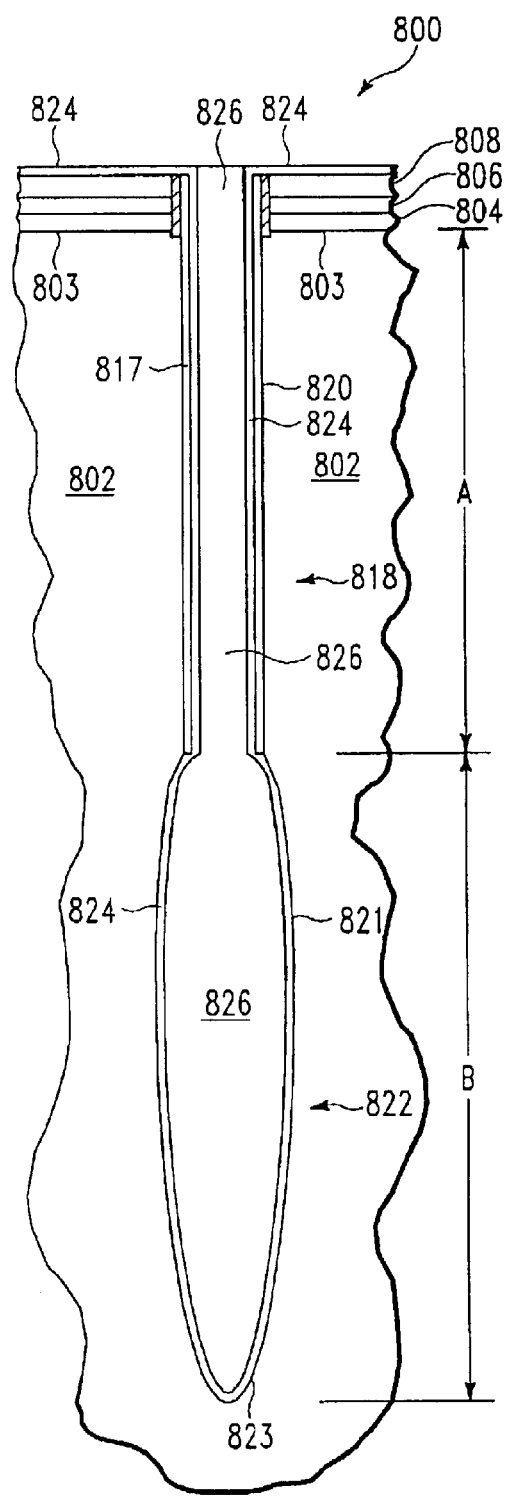
FIG. 8I shows the structure of FIG. 8H after etchback of the portion of the polysilicon layer 826 overlying the field surface.
Figure 8J:
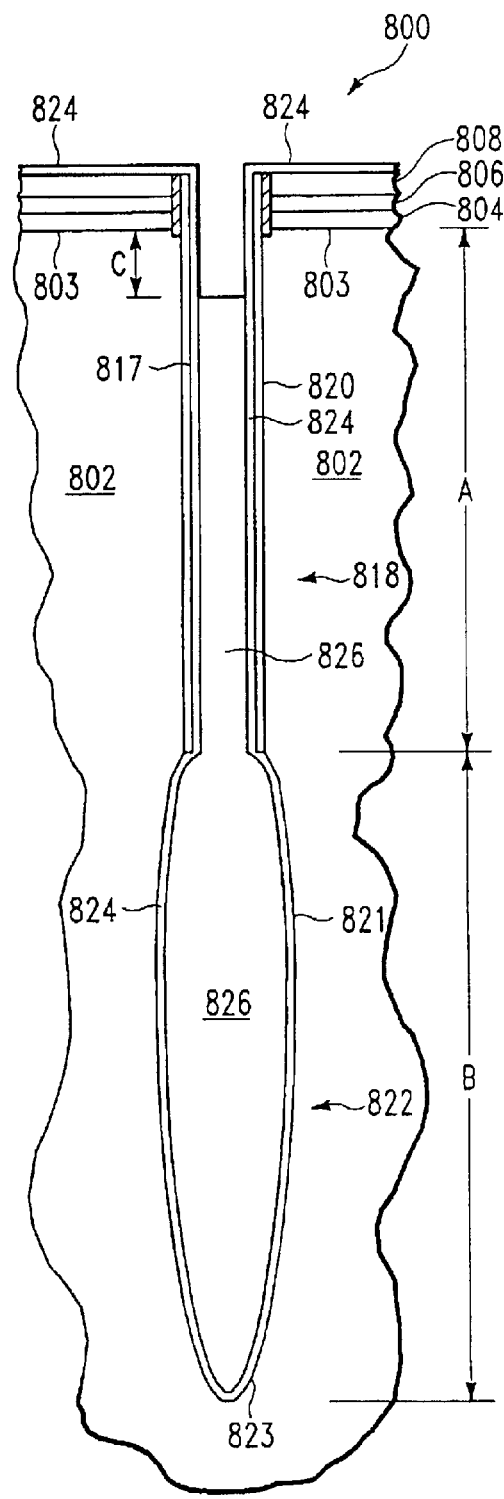
FIG. 8J shows the structure of FIG. 8I after etchback of the polysilicon layer 826 to a predetermined depth C within the shaped opening 818.

Referring to FIG. 8J, the polysilicon 826 was then etched back to a predetermined depth C within the shaped opening 818 (in this case, approximately 150 Å below the polysilicon surface). A preferred method for etching polysilicon is disclosed in commonly assigned U.S. Pat. No. 6,074,954 to Lill et al., issued Jan. 13, 2000, the disclosure of which is hereby incorporated by reference in its entirety.

As device geometries continue to scale down, it becomes increasingly difficult to control the shape of the surface which is being etched. This is particularly true with regard to deep trenches having feature sizes of 0.3 μm or less and aspect ratios in excess of 20. The shape of the leading edge of the surface being etched, which is commonly referred to as the "etch front", is of critical importance. If the shape of the etch front is not flat, sculpturing of subsequently deposited layers of material (e.g., during protective layer etch) may be difficult and the accuracy of interferometric endpoint determination during etch processing may be reduced.

The method disclosed by Lill et al. for etching polysilicon results in the formation of a substantially flat etch front. In general, the method of Lill et al. comprises isotropically etching polysilicon using a plasma produced from a plasma source gas comprising a reactive species which selectively etches polysilicon. The plasma source gas comprises from about 80% to about 95% by volume of a fluorine-comprising gas, and from about 5% to about 20% by volume of an additive gas selected from a group consisting of a bromine-comprising gas, a chlorine-comprising gas, an iodine-comprising gas, or a combination thereof. Bromine-comprising and chlorine-comprising gases, and combinations thereof, are the more preferred additive gases. For example, and not by way of limitation, the additive gas may comprise HBr, $CH_3Br$, $CH_2Br_2$, $Cl_2$, HCl, HI, or a combination thereof, with a combination of HBr and $Cl_2$ being most preferred.

The particular additive gas, or combination of additive gases, used will depend upon a number of factors, such as the etch depth. For example, HBr reacts more slowly with polysilicon than does chlorine and, as such, HBr provides a more controlled etch. HBr also has a stronger effect on the etch profile than does chlorine, but the etch selectivity for polysilicon over the silicon nitride etch barrier is lower with HBr than with chlorine. Therefore, for shallow etch depths (which typically have very short etch times, often under 20 seconds, and where etch barrier loss is not as critical), it would be preferred to increase the HBr content of the plasma source gas in order to slow down the etch rate to provide a more controlled etch profile.

On the other hand, chlorine has less of an effect on the etch profile than does HBr, and the etch selectivity for polysilicon over the silicon nitride etch barrier material is greater with chlorine than with HBr. Therefore, for deep etches, where a more rapid etch rate might be desired, and where etch selectivity for polysilicon over silicon nitride is crucial, the chlorine content of the plasma source gas should be increased.

The principal component of the plasma source gas, which makes up about 80–95% of the plasma source gas composition, comprises a fluorine-comprising gas, such as $SF_6$, $SF_4$, $S_2F_2$, $S_2F_{10}$, $NF_3$, and combinations thereof. Plasma source gases which contain (in addition to fluorine) potentially reactive species such as oxygen or carbon, for example, and not by way of limitation, $F_2O$, $F_2O_2$, NOF, $NO_2F$, $CF_4$, $CH_2F_2$, $CHF_3$, $CH_3F$, and combinations thereof, may also be used, but are less preferred. Gases comprising oxygen are less preferred because oxygen dramatically reduces the etch selectivity toward polysilicon over the silicon nitride etch barrier. The use of carbon-comprising gases may result in the formation of undesirable polymers. The most preferred fluorine-comprising gas is $SF_6$.

In addition to the etchant gases, the plasma source gas may also include an essentially nonreactive gas, typically a noble gas such as helium or argon, as a diluent for the reactive species, in order to slow down the etching reaction. Therefore, for shallow etch depths, it might be desirable to increase the concentration of the nonreactive gas in the plasma source gas to provide for a slower, more controlled etch. The nonreactive gas may be present in the plasma source gas at a ratio of up to 9:1 to the other constituents of the plasma source gas. (NOTE: The percentages set forth above are based on the sum of the source gases which produce reactant species and do not include nonreactive, diluent gases which may be used in any quantity which is beneficial, depending on the apparatus used and the process conditions in general. One skilled in the art can determine with minimal experimentation a proper amount of a diluent gas which should be used.

When an Applied Materials' Silicon Etch CENTURA® DPS™ etch system is used, for example, a plasma source gas may comprise the following gases at the following flow rates: 20 to 200 sccm $SF_6$, 0 to 50 sccm HBr, 0 to 50 sccm $Cl_2$, and 0 to 200 sccm He. A combination of 30 to 100 sccm $SF_6$, 0 to 10 sccm HBr, 0 to 10 sccm $Cl_2$, and 0 to 100 sccm He provides an excellent source gas, where at least either HBr or $Cl_2$ is present with the $SF_6$.

Other typical process conditions for the isotropic polysilicon etchback are set forth in Table One and discussed below:

TABLE ONE

Typical Process Conditions for Isotropic Polysilicon Etchback

| | |
|---|---|
| Substrate Temperature | 65° C. |
| Process Chamber Wall Temperature | 20° C. |
| Chamber Pressure | 10–20 mTorr |
| RF Source Power | 50–800 W |
| RE Source Frequency | 12–14 MHZ |
| Bias Power | self-bias (~–5 to –10 eV) |

Substrate bias reduces the selectivity of the plasma source gas to the silicon nitride etch barrier. Therefore, no bias power is typically applied to the substrate, and a relatively high chamber pressure of about 10 mTorr to about 20 mTorr (preferably, about 15 mTorr to about 20 mTorr) is used to minimize the amount of self-bias on the substrate.

The lower the source power, the slower the etch rate. Therefore, for shallow etches, a source power toward the lower end of the range (i.e., approximately 50 W to 200 W) is preferred.

The following specific process conditions were used for the etchback of polysilicon: Gas flow was 30 sccm $SF_6$ and 10 sccm HBr. The process chamber pressure was 10 mTorr. An RF source power of 200 W was provided at a frequency of 13.56 MHZ. No bias power was applied. The substrate temperature was approximately 65° C. The process chamber wall temperature was approximately 20° C. Etch time was approximately 20 seconds.

In a preferred embodiment, the portion of the polysilicon 826 overlying the field surface is first removed by an in situ etchback at a lower process chamber pressure (i.e., approximately 5 mTorr to 10 mTorr), as shown in FIG. 8I The lower pressure results in an aggressive, uniform etch with a lower selectivity for etching polysilicon relative to the conformal dielectric film 824. After the conformal dielectric film 824 has been exposed by removal of the overlying polysilicon 826, a higher pressure (i.e., approximately 20 mTorr to 30 mTorr) etch is used to remove the polysilicon 826 to predetermined depth C, as shown in FIG. 8J. The higher pressure etch has a greater selectivity for etching polysilicon relative to the conformal dielectric film 824, leaving the conformal dielectric film substantially undisturbed.

Figures 8K, 8L:
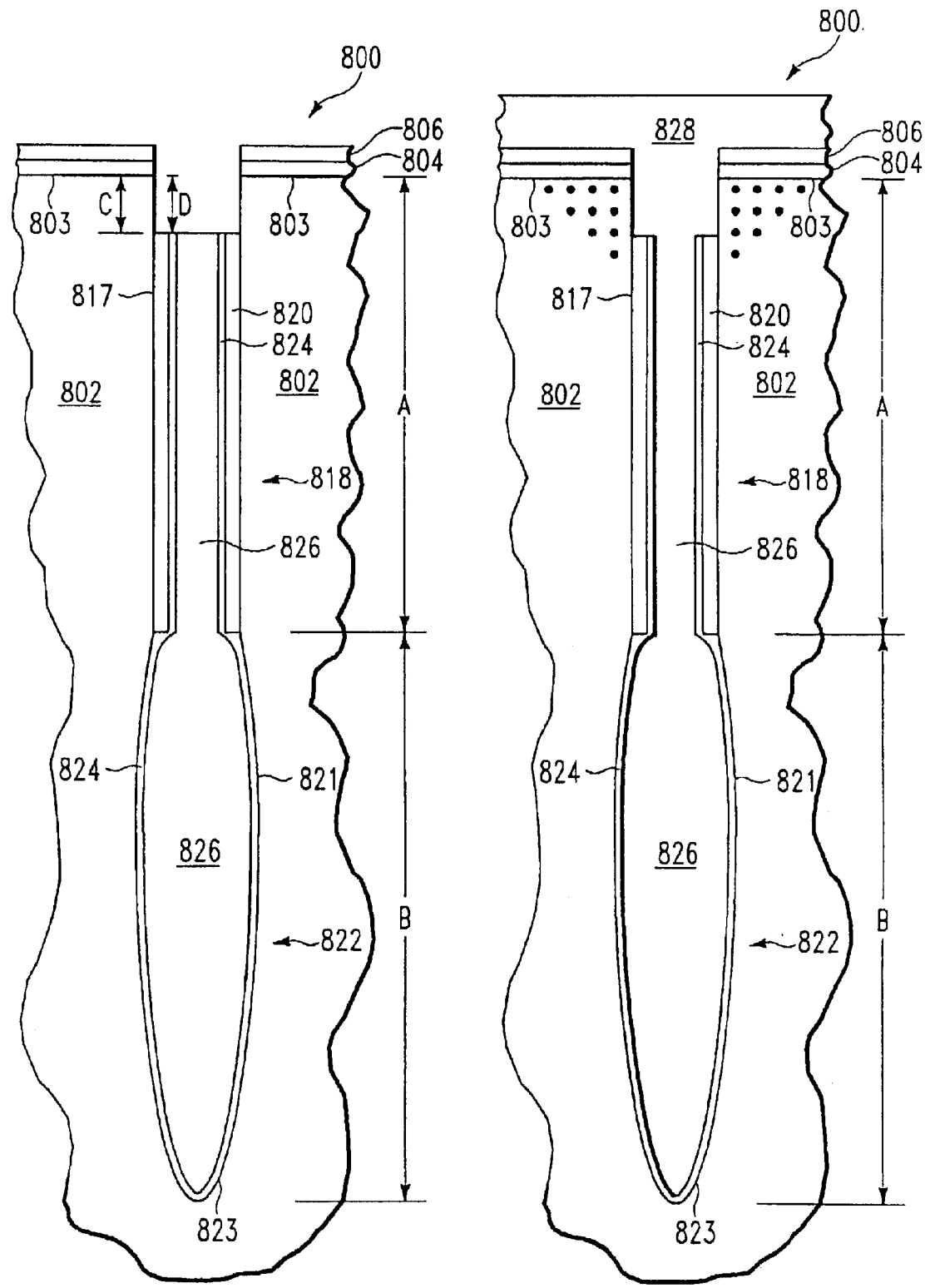
FIG. 8K shows the structure of FIG. 8J after etchback of the conformal dielectric film 824 and the protective layer 820 to a predetermined depth D which, in this case, is equal to depth C, so that the tops of the conformal dielectric film 824 and the protective layer 820 are level with the top of the polysilicon layer 826. The remaining silicon oxide masking layer 808 is also removed during this etching step.
FIG. 8L shows the structure of FIG. 8K after refilling of the shaped opening 818 with a layer 828 of doped polysilicon.

Referring to FIG. 8K, a wet etch step was then performed to remove the upper portions of the conformal dielectric film 824 and the protective layer 820 to a predetermined depth D (in this case, approximately 150 Å the polysilicon surface). Depth D is typically equal to Depth C, i.e., the conformal dielectric film 824 and the protective layer 820 are etched back such that the tops of the conformal dielectric film and the protective layer are even with the top surface of the polysilicon layer 826. The remaining masking layer 808 was also removed during this wet etch step.

The wet etch step was performed using a buffered HF solution (6:1 buffer : HF ratio).

Referring to FIG. 8L, the portion of the shaped opening 818 above the protective layer 820 was then refilled with polysilicon 828, as described above. The polysilicon 828 typically contains a dopant such as, for example, arsenic, phosphorus, antimony, or bismuth, to facilitate electron transfer.

Figure 8M:
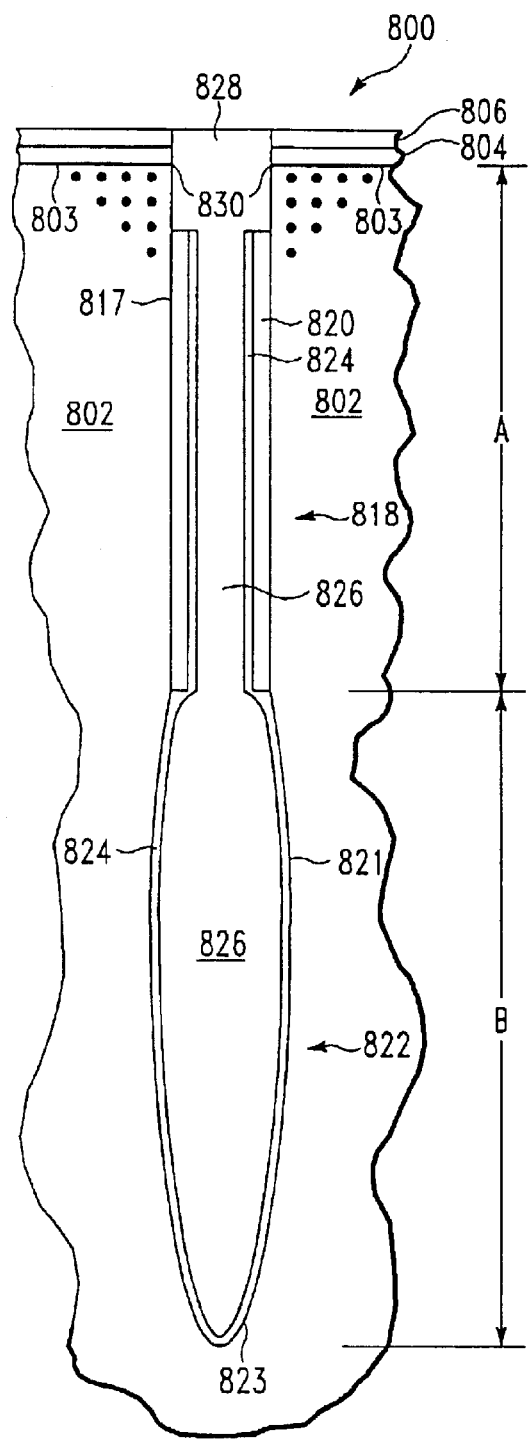
FIG. 8M shows the structure of FIG. 8L after etchback of the portion of the polysilicon layer 828 overlying the field surface.
Figure 8N:
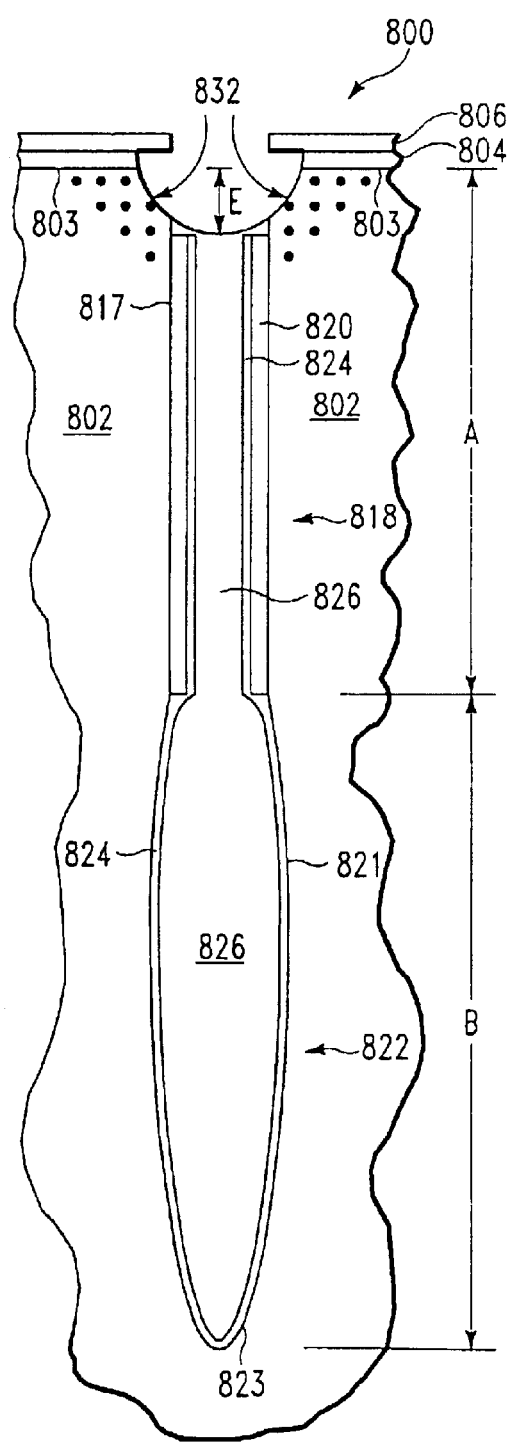

Referring to FIG. 8N, a final isotropic etch step was performed to remove the polysilicon 828 to a predetermined depth E within the shaped opening 818 (in this case, approximately 50–100 Å below the polysilicon surface) and to remove the corners 830 (shown in FIG. 8M) of the single-crystal silicon substrate 802 from the top portion of the sidewall 817 above the protective layer 820. A portion of the gate dielectric layer 804 is typically undercut during the removal of the corners 830 of the single-crystal silicon substrate 802.

The plasma source gas composition and general process parameters used for this polysilicon etchback step were the same as those used for the previous polysilicon etchback step described above. Specific process parameters for the polysilicon etchback were as follows: Gas flow was 30 sccm $SF_6$ and 10 sccm HBr. The process chamber pressure was 10 mTorr. An RF source power of 150 W was provided at a frequency of 13.56 MHZ. Bias power was 5–10 W. The substrate temperature was approximately 65° C. The process chamber wall temperature was approximately 20° C. Etch time was approximately 15 seconds.

In a preferred embodiment, the portion of the polysilicon 828 overlying the field surface is first removed by an in situ etchback at a lower process chamber pressure (i.e., approximately 5 mTorr to 10 mTorr), as shown in FIG. 8M. The lower pressure results in an aggressive, uniform etch with a lower selectivity for etching polysilicon relative to the silicon nitride etch barrier 806. After the silicon nitride etch barrier 806 has been exposed by removal of the overlying polysilicon layer 826, a higher pressure (i.e., approximately 20 mTorr to 30 mTorr) etch is used to remove the polysilicon 826 to predetermined depth E, as shown in FIG. 8N. The higher pressure etch has a greater selectivity for etching polysilicon relative to the silicon nitride etch barrier 806, leaving the etch barrier layer substantially undisturbed.

The ultimate goal of the final polysilicon etch step is to remove the top corners of the single-crystal silicon substrate in order to open up what is known as a "buried strap" 832, which allows electrons to flow from the top portion of the shaped opening to the center section of the shaped cavity. The use of a doped polysilicon for at least the last polysilicon fill step serves to facilitate electron transfer through the strap region. (NOTE: The doped polysilicon in the region of the buried strap is indicated by stippling in FIGS. 8L–8N.)

The above described preferred embodiments are not intended to limit the scope of the present invention, as one skilled in the art can, in view of the present disclosure, expand such embodiments to correspond with the subject matter of the invention claimed below.

We claim:

1. A method of forming a multi-part cavity in a substrate, the method comprising the steps of:
    a) etching said substrate to a first predetermined depth to form a shaped opening;
    b) forming a conformal protective layer overlying at least a sidewall of said shaped opening, wherein said protective layer comprises a material having a different etch selectivity than said substrate; and c) etching said substrate to a second predetermined depth to form a shaped cavity using a plasma generated from an etchant source gas which selectively etches said substrate relative to said protective layer, wherein said shaped cavity directly and completely underlies and is in continuous communication with said shaped opening, wherein at least a portion of said shaped cavity exhibits a cross sectional dimension on a plane parallel with the upper surface of said substrate, which cross-sectional dimension is larger than the largest cross-sectional dimension of said shaped opening on a plane parallel with said substrate upper surface, and whereby said protective layer effectively preserves the profile of said shaped opening during etching of said shaped cavity, whereby the shape of said shaped cavity is controlled.

2. The method of claim 1, wherein said protective layer covers at least a portion of the bottom of said shaped opening, and wherein said method further comprises step b-2), which is performed after step b) and prior to step c):
   b-2) anisotropically etching said protective layer to remove the portion of said protective layer overlying the bottom of said shaped opening, whereby at least a portion of substrate at the bottom of said shaped opening is exposed.

3. The method of claim 1, wherein said substrate consists essentially of material selected from the group consisting of single-crystal silicon, silicon oxide, silicon nitride, aluminum, polyimide, polyarylene ether based organic polymer, similar to BCB which does not contain silicon, diamond, and di-vinyl siloxane benzocyclobutene.

4. The method of claim 1, wherein said substrate comprises silicon oxide, and said protective layer comprises a material selected from the group consisting of polysilicon, silicon nitride, titanium nitride, aluminum, diamond, and polyimide.

5. The method of claim 4, wherein said substrate comprises silicon oxide, and said protective layer comprises a material selected from the group consisting of polysilicon and silicon nitride.

6. The method of claim 1, wherein said method includes the additional step of:
   d) forming a conformal layer of a material over interior surfaces of the shaped opening and shaped cavity, wherein said conformal layer does not fill said shaped cavity.

7. The method of claim 6, wherein said conformal layer of fill material has a thickness on all surfaces which is equal to at least one-half of the width of said shaped opening, whereby said shaped opening is completely occluded.

8. The method of claim 6, wherein said method further comprises step c-2), which is performed after step c) and prior to step d):
   c-2) removing said protective layer from surfaces of said shaped opening.

9. The method of claim 6 or claim 7 or claim 8, wherein said substrate and said fill material comprise the same material.

10. The method of claim 1, wherein said protective layer is formed to have a thickness within the range of about 10 Å to about 500 Å on at least a sidewall of said shaped opening.

11. The method of claim 1, wherein said shaped cavity has an aspect ratio in excess of about 20:1.

12. A method of forming a multi-part cavity in a silicon oxide substrate, the method comprising the steps of:
   a) etching said silicon oxide substrate to a first predetermined depth to form a shaped opening, wherein etching is performed using a plasma generated from a gas selected from the group consisting of $CF_4$ and $C_4F_8$;
   b) forming a conformal protective layer overlying at least a sidewall of said shaped opening, wherein said protective layer comprises poly silicon; and
   c) etching said silicon oxide substrate to a second predetermined depth to form a shaped cavity using a plasma generated from a gas selected from the group consisting of $CF_4$ and $C_6F_8$, wherein said shaped cavity directly and completely underlies and is in continuous communication with said shaped opening, wherein at least a portion of said shaped cavity exhibits a cross sectional dimension on a plane parallel with the upper surface of said substrate, which cross-sectional dimension is larger than the largest cross-sectional dimension of said shaped opening on a plane parallel with said substrate upper surface, and whereby said protective layer effectively preserves the profile of said shaped opening during etching of said shaped cavity, whereby the shape of said shaped cavity is controlled.

13. The method of claim 12, wherein etching of said silicon oxide substrate form said shaped opening and to form said shaped cavity is performed using a plasma generated from a source gas comprising $C_4F_8$, Ar and CO.

14. The method of claim 12, wherein said protective layer covers at least a portion of the bottom of said shaped opening, and wherein said method further comprises step b-2), which is performed after step b) and prior to step c):
   b-2) anisotropically etching said protective layer to remove the portion of said protective layer overlying the bottom of said shaped opening, wherein etching is performed using a plasma generated from a source gas comprising $SF_6$, and whereby at least a portion of substrate at the bottom of said shaped opening is exposed.

15. The method of claim 14, wherein etching of said protective layer is performed using a plasma generated from a source gas comprising $SF_6$, HBr, and $O_2$.

16. The method of claim 12, wherein said method includes the additional step of:
   d) forming a conformal layer of a material over interior surfaces of the shaped opening and shaped cavity, wherein said conformal layer does not fill said shaped cavity.

17. The method of claim 16, wherein said conformal layer of fill material has a thickness on all surfaces which is equal to at least one-half of the width of said shaped opening, whereby said shaped opening is completely occluded.

18. The method of claim 16, wherein said method further comprises step c-2), which is performed after step c) and prior to step d);
   c-2) removing said protective layer from surfaces of said shaped opening.

19. The method of claim 16 or claim 17 or claim 18, wherein said substrate and said fill material comprise the same material.

20. The method of claim 12, wherein said protective layer is formed to have a thickness within the range of about 10 Å to about 500 Å on at least a sidewall of said shaped opening.

21. The method of claim 12, wherein said shaped cavity has an aspect ratio in excess of about 20:1.

* * * * *